(12) United States Patent
Murakami et al.

(10) Patent No.: US 9,646,988 B2
(45) Date of Patent: May 9, 2017

(54) SEMICONDUCTOR MEMORY DEVICE AND METHOD FOR MANUFACTURING SAME

(71) Applicant: Kabushiki Kaisha Toshiba, Minato-ku (JP)

(72) Inventors: Sadatoshi Murakami, Yokohama (JP); Hiroomi Nakajima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/845,944

(22) Filed: Sep. 4, 2015

(65) Prior Publication Data

US 2016/0268297 A1 Sep. 15, 2016

Related U.S. Application Data

(60) Provisional application No. 62/133,135, filed on Mar. 13, 2015.

(51) Int. Cl.
| | |
|---|---|
| *H01L 29/792* | (2006.01) |
| *H01L 21/336* | (2006.01) |
| *H01L 27/11582* | (2017.01) |
| *H01L 21/28* | (2006.01) |
| *H01L 27/11573* | (2017.01) |
| *H01L 29/66* | (2006.01) |
| *H01L 27/11568* | (2017.01) |
| *H01L 29/423* | (2006.01) |
| *H01L 21/8238* | (2006.01) |

(Continued)

(52) U.S. Cl.
CPC .. *H01L 27/11582* (2013.01); *H01L 21/28282* (2013.01); *H01L 21/823462* (2013.01); *H01L 21/823857* (2013.01); *H01L 27/11568* (2013.01); *H01L 27/11573* (2013.01); *H01L 27/11575* (2013.01); *H01L 27/11578* (2013.01); *H01L 29/4234* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | | |
|---|---|---|---|
| 6,025,620 | A | 2/2000 | Kimura et al. |
| 8,169,826 | B2 | 5/2012 | Hishida et al. |
| (Continued) | | | |

FOREIGN PATENT DOCUMENTS

JP    9-213912    8/1997

*Primary Examiner* — Minh-Loan Tran
(74) *Attorney, Agent, or Firm* — Oblon, McClelland, Maier & Neustadt, L.L.P.

(57) ABSTRACT

According to one embodiment, a semiconductor memory device includes a substrate; a stacked body provided on the substrate, the stacked body including a plurality of electrode layers and a first step portion, the first step portion having the plurality of electrode layers provided stepwise; a column provided in a region of the stacked body other than a region in the first step portion provided; and a plurality of insulating portions provided in the first step portion. The stacked body includes a metal silicide portion provided between the plurality of insulating portions and the plurality of electrode layers, a plurality of terraces provided on a top surface of each of the plurality of electrode layers of the first step portion, and a plurality of contact portions provided on the plurality of terraces.

20 Claims, 24 Drawing Sheets

(51) Int. Cl.
*H01L 27/11578* (2017.01)
*H01L 21/8234* (2006.01)
*H01L 27/11575* (2017.01)

(56) References Cited

U.S. PATENT DOCUMENTS

| | | | | |
|---|---|---|---|---|
| 8,278,695 B2 * | 10/2012 | Kidoh | ............... | H01L 21/8221 257/314 |
| 8,372,720 B2 | 2/2013 | Fukuzumi et al. | | |
| 8,729,624 B2 | 5/2014 | Fukuzumi et al. | | |
| 9,035,374 B2 | 5/2015 | Fukuzumi et al. | | |
| 2010/0133599 A1 * | 6/2010 | Chae | ............... | H01L 27/11578 257/315 |
| 2010/0327339 A1 * | 12/2010 | Tanaka | ............. | H01L 27/11573 257/324 |
| 2015/0036407 A1 * | 2/2015 | Nakajima | ............ | H01Q 1/2283 365/63 |
| 2015/0179564 A1 * | 6/2015 | Lee | ................ | H01L 27/11548 257/756 |
| 2016/0322374 A1 * | 11/2016 | Sano | ............... | H01L 21/31111 |

\* cited by examiner

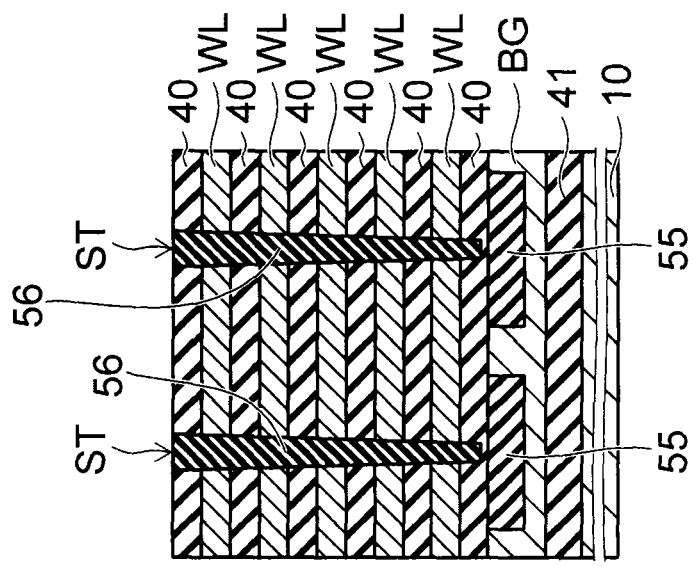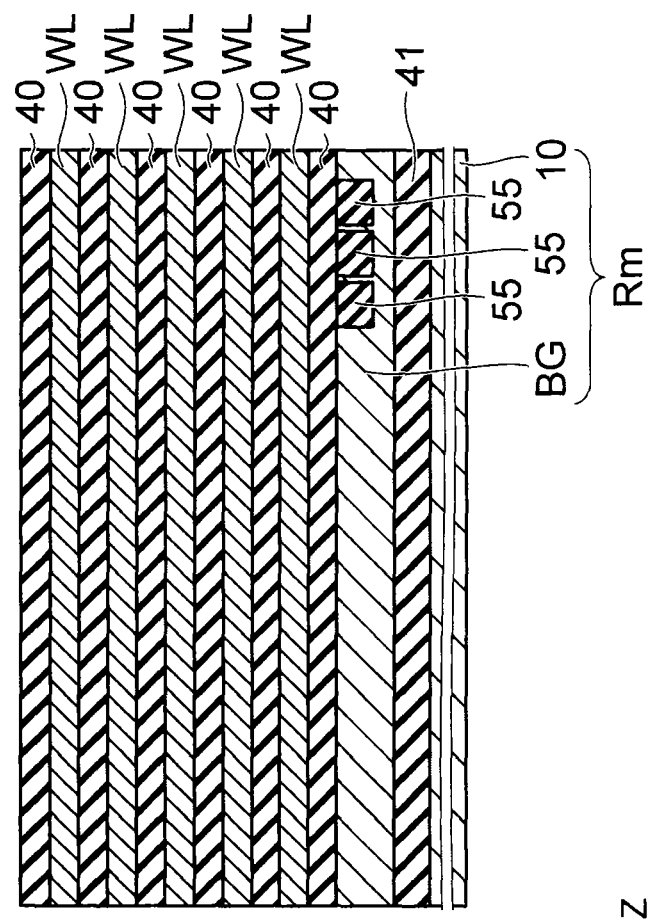
FIG. 5A
FIG. 5B

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 62/133,135 field on Mar. 13, 2015; the entire contents of which are incorporated herein by reference.

FIELD

Embodiments described herein relate generally to a semiconductor memory device and a method for manufacturing same.

BACKGROUND

Memory devices having a three-dimensional structure in which electrode layers function as control gates in each memory cell have been proposed. In these memory devices, a plurality of electrode layers is formed separated by insulating layers. Memory holes are formed in the resulting stacked body, and silicon bodies that serve as channels are formed along the sidewalls of the memory holes with charge storage films disposed therebetween.

An increase in the number of stacked layers in the stacked body leads to an increase in the distance from a contact portion that supplies a current to the memory cell. This may lead to the disadvantage of increasing resistance.

BRIEF DESCRIPTION OF THE DRAWINGS

FIG. 5A to FIG. 10 are schematic cross-sectional views showing a method for manufacturing the semiconductor memory device of the embodiment;

FIG. 11A to FIG. 18B are schematic cross-sectional views showing another method for manufacturing the semiconductor memory device of the embodiment;

DETAILED DESCRIPTION

Figure 1:
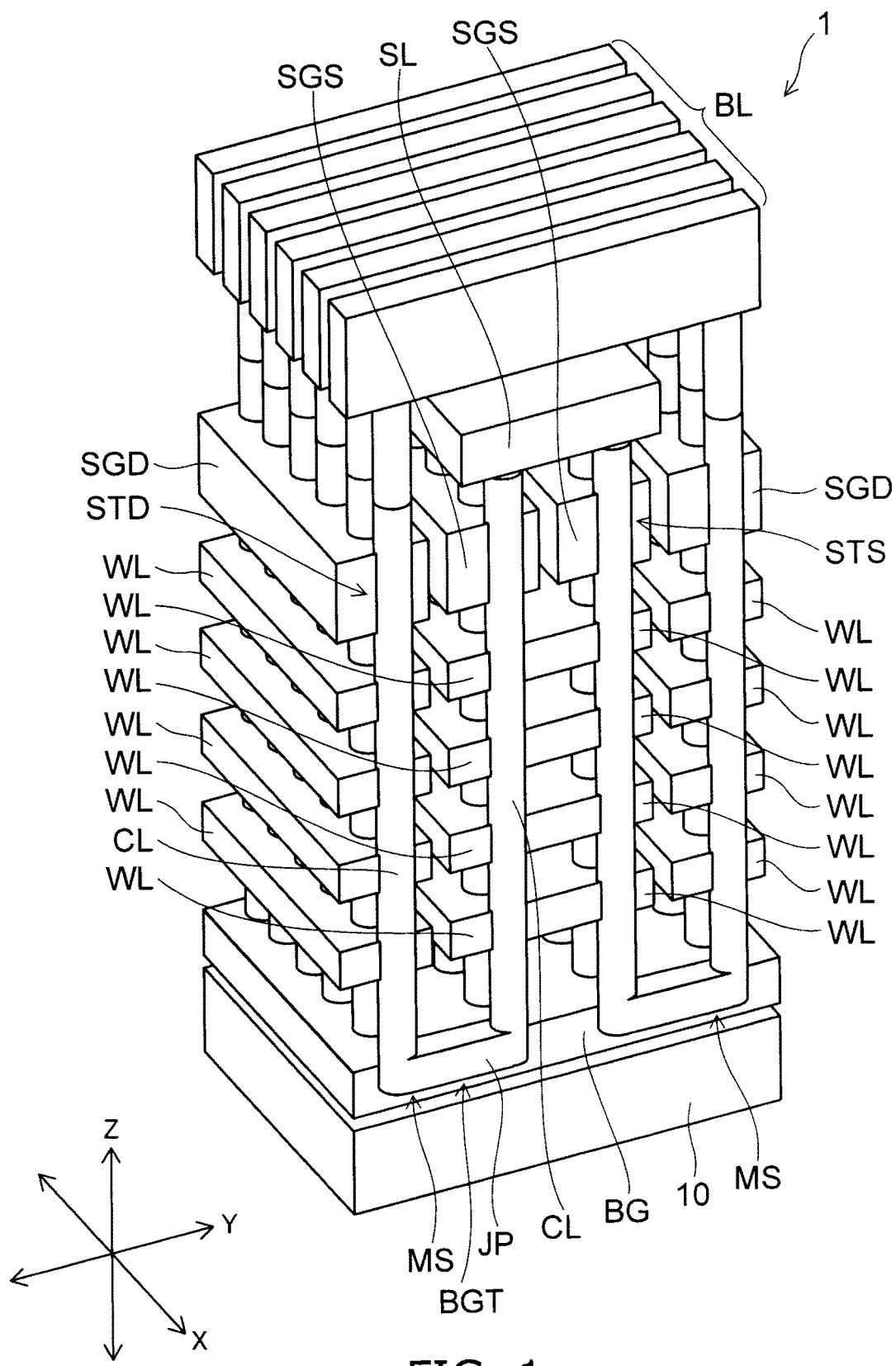
FIG. 1 is a schematic perspective view of a memory cell array of an embodiment.

According to one embodiment, a semiconductor memory device includes a substrate; a stacked body provided on the substrate, the stacked body including a plurality of electrode layers and a first step portion, the plurality of electrode layers separately stacked each other, the first step portion having the plurality of electrode layers provided stepwise; a column provided in a region of the stacked body other than a region in the first step portion provided, the column extending in a stacking direction of the stacked body; and a plurality of insulating portions provided in the first step portion, and extending in the stacking direction. The column includes a semiconductor film extending in the stacking direction, and a charge storage film provided between the semiconductor film and the plurality of electrode layers. The stacked body includes a metal silicide portion provided between the plurality of insulating portions and the plurality of electrode layers, a plurality of terraces provided on a top surface of each of the plurality of electrode layers of the first step portion, and a plurality of contact portions provided on the plurality of terraces.

Embodiments will be described below with reference to drawings. Note that the same reference numerals are applied for the same elements in each drawing.

FIG. 1 is a perspective view schematically illustrating a memory cell array 1 according to an embodiment. For simplicity, elements such as insulating layers are not illustrated in FIG. 1.

In FIG. 1, two directions orthogonal to each other are an X-axis direction and a Y-axis direction. Another direction orthogonal to the X-axis direction and the Y-axis direction (XY plane) is a Z-axis direction (stacking direction), a plurality of electrode layers WL stacked in Z-axis direction.

Figure 2:
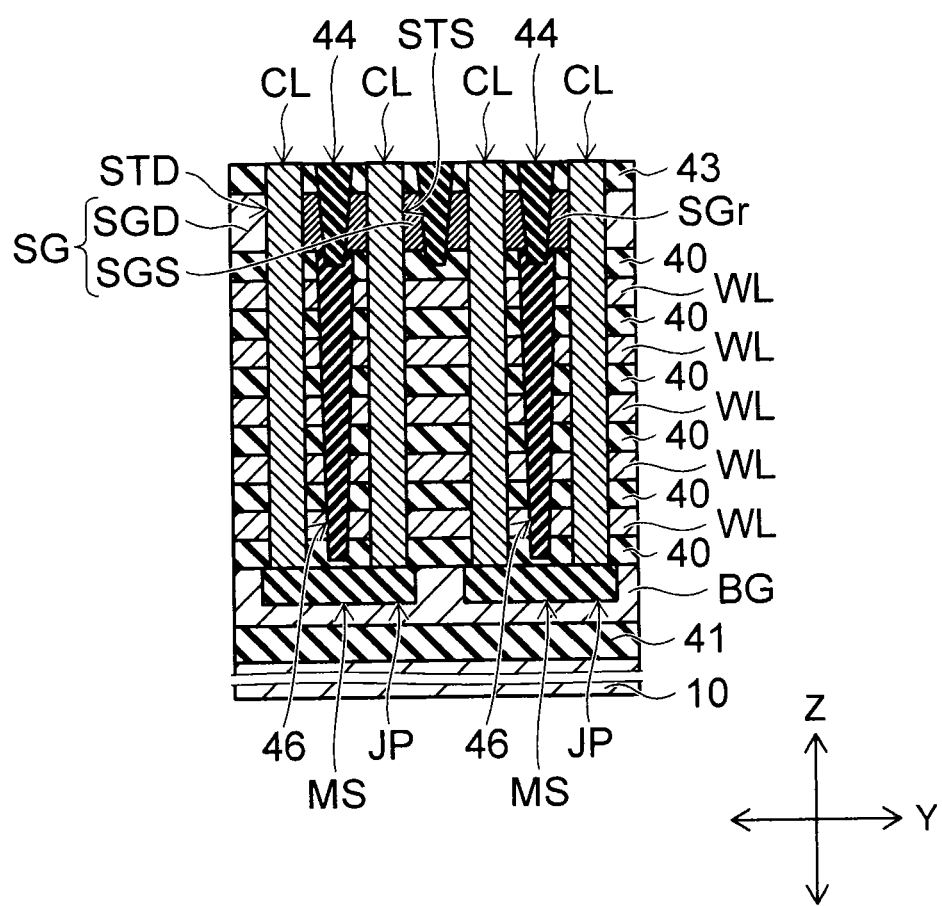
FIG. 2 is a schematic cross-sectional view of the memory strings of the embodiment.

The memory cell array 1 includes a plurality of memory strings MS. FIG. 2 is a cross-sectional view schematically illustrating the memory strings MS. The cross section illustrated in FIG. 2 runs parallel to the YZ plane in FIG. 1. In FIG. 2, portions upper than an insulating layer 43 are omitted.

The memory cell array 1 includes a stacked body, the stacked body includes a plurality of the electrode layers WL and a plurality of insulating layers 40. The electrode layers WL are separately stacked each other. For example, each of the electrode layers WL and each of the insulating layers are alternately stacked. The insulating layers 40 are each provided between the electrode layers WL. The stacked body is provided on a back gate BG that serves as a lower select gate (lower gate layer). The number of the electrode layers WL illustrated in the drawings is an example, and the number of the electrode layers WL is optional. The back gate BG is provided on a substrate 10 with an insulating layer 41 disposed therebetween.

The back gate BG and the electrode layer WL are layers primarily made from silicon, such as polycrystalline silicon layers. Furthermore, the back gate BG and the electrode layer WL contain boron as impurities for imparting conductivity to the silicon layers, for example. The electrode layer WL may contain metal silicide. The insulating layer 40 is made primarily from silicon oxide, for example.

A single memory string MS has a U-shape and includes a pair of columns CL and a connecting portion JP. The pair of columns CL extends in the Z-axis direction, and the connecting portion JP connects the respective bottom ends of the pair of columns CL. The columns CL, for example, have columnar or elliptic columnar, are provided in the stacked body, and in contact with the back gate BG.

A drain-side select gate SGD is provided at a top end of one of the pair of columns CL in the U-shaped memory string MS, and a source-side select gate SGS is provided at a top end of the other. The drain-side select gate SGD and the source-side select gate SGS are each provided as an upper select gate (upper gate layer) on the topmost layer of the electrode layers WL with the insulating layer 40 disposed therebetween.

The drain-side select gate SGD and the source-side select gate SGS are layers primarily made from silicon. The drain-side select gate SGD and the source-side select gate SGS contain boron, for example, as impurities for imparting conductivity to the silicon layers.

An insulating separator 44 is provided between the drain-side select gate SGD and the source-side select gate SGS. The insulating separator 44 separates the drain-side select gate SGD from the source-side select gate SGS in the Y-axis direction.

An insulating separator 46 is provided between the stacked body under the drain-side select gate SGD and the stacked body under the source-side select gate SGS. The insulating separator 46 separates the stacked body under the drain-side select gate SGD from the stacked body under the source-side select gate SGS in the Y-axis direction. In other words, the upper select gate and the stacked body between the pair of columns CL of the memory string MS are separated in the Y-axis direction by the insulating separators 44, 46.

In the example illustrated in FIG. 2, the insulating separator 44 and the insulating separator 46 are integrally connected in the Z-axis direction (stacking direction).

As illustrated in FIG. 1, a source layer SL (a metal film, for example) is formed on the source-side select gate SGS with the insulating layer 43 disposed therebetween. As illustrated in FIG. 1, a plurality of bit lines (metal films, for example) BL are formed on the drain-side select gate SGD and the source layer SL with the insulating layer disposed therebetween. Each of the bit lines BL extends in the Y-axis direction.

Figure 3:
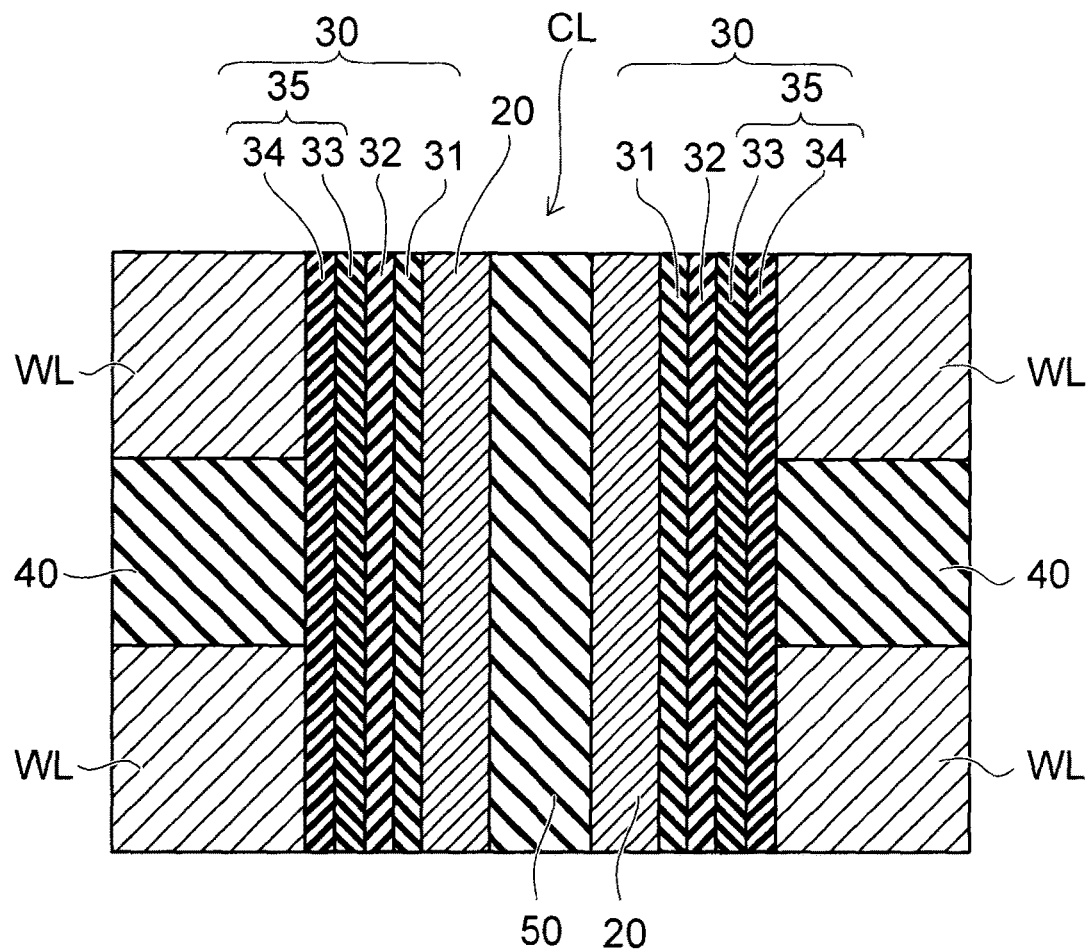
FIG. 3 is an enlarged schematic cross-sectional view of a part of the column of the embodiment.

FIG. 3 is an enlarged cross-sectional view schematically illustrating a portion of the column CL of the embodiment.

The column CL is formed within the U-shaped memory hole formed within the stacked body that includes the plurality of electrode layers WL, the plurality of insulating layers 40, and the back gate BG. A channel body 20 (semiconductor film) is provided as a semiconductor channel within the memory hole. The channel body 20 is, for example, a silicon film. The impurity concentration of the channel body 20 is lower than the impurity concentration of the electrode layer WL.

A memory film 30 is formed between the inner wall of the memory hole and the channel body 20. The memory film 30 includes a block insulating film 35, a charge storage film 32, and a tunnel insulating film 31.

The block insulating film 35, the charge storage film 32, and the tunnel insulating film 31 are formed, in order from the electrode layer WL side, between the electrode layers WL and the channel body 20.

The channel body 20 is formed in a tubular shape that extends in the stacking direction of the stacked body, and the memory film 30 is formed in a tubular shape, extending in the stacking direction of the stacked body so as to surround an outer peripheral surface of the channel body 20. The electrode layer WL surrounds the channel body 20 with the memory film 30 disposed therebetween. Also, a core insulating film 50 is formed on an inner side of the channel body 20. The core insulating film 50 is, for example, a silicon oxide film.

The block insulating film 35 comes into contact with the electrode layer WL, the tunnel insulating film 31 comes into contact with the channel body 20, and the charge storage film 32 is formed between the block insulating film 35 and the tunnel insulating film 31.

The channel body 20 functions as a channel in the memory cell, and the electrode layer WL functions as a control gate of the memory cell. The charge storage film 32 functions as a data memory layer that stores electric charge injected from the channel body 20. In other words, a memory cell is formed in a configuration in which a control gate surrounds a channel at the location where the channel body 20 and each of the electrode layers WL intersect.

The semiconductor memory device of the embodiment is a non-volatile semiconductor memory device that can electrically and freely erase and write data and that can retain memory contents even if the power supply is turned off.

The memory cell is of a charge trap type, for example. The charge storage film 32 includes a number of trapping sites for trapping electric charge, and is, for example, a silicon nitride film.

The tunnel insulating film 31 functions as a potential barrier when electric charge is injected from the channel body 20 into the charge storage film 32 or when electric charge stored in the charge storage film 32 is diffused to the channel body 20. The tunnel insulating film 31 is, for example, a silicon oxide film.

Alternatively, a stacked film (ONO film) in which a silicon nitride film is interposed between a pair of silicon oxide films may be used for the tunnel insulating film 31. When the ONO film is used for the tunnel insulating film 31, the erasing operation can be performed in a lower electric field than when a single-layer silicon oxide film is used.

The block insulating film 35 prevents electric charge stored in the charge storage film 32 from diffusing to the electrode layer WL. The block insulating film 35 includes a cap film 34 provided coming into contact with the electrode layer WL, and a block film 33 provided between the cap film 34 and the charge storage film 32.

The block film 33 is, for example, a silicon oxide film. The cap film 34 has a higher dielectric constant than silicon oxide, and is a silicon nitride film, for example. With such a cap film 34 provided coming into contact with the electrode layer WL, it is possible to suppress back tunneling electrons from being injected from the electrode layer WL during erasing. That is, use of the stacked film of the silicon oxide film and silicon nitride film for the block insulating film 35 makes it possible to increase the electric charge blocking effect.

As illustrated in FIGS. 1 and 2, a drain-side select transistor STD is provided at the top end of one of the pair of columns CL in the U-shaped memory string MS, and a source-side select transistor STS is provided at the top end of the other.

The memory cell, the drain-side select transistor STD, and the source-side select transistor STS are vertical transistors in which a current flows in the stacking direction (Z-axis direction) of the stacked body.

The drain-side select gate SGD functions as a gate electrode (control gate) for the drain-side select transistor STD. An insulating film that functions as a gate insulating film for the drain-side select transistor STD is provided between the drain-side select gate SGD and the channel body 20. The channel body 20 of the drain-side select transistor STD is connected to one of the bit lines BL above the drain-side select gate SGD.

The source-side select gate SGS functions as a gate electrode (control gate) for the source-side select transistor STS. An insulating film that functions as a gate insulating film for the source-side select transistor STS is provided between the source-side select gate SGS and the channel body 20. The channel body 20 of the source-side select transistor STS is connected to the source layer SL above the source-side select gate SGS.

A back gate transistor is provided on the connecting portion JP of the memory string MS. The back gate BG functions as a gate electrode (control gate) for the back gate transistor. The memory film 30 provided within the back gate BG functions as a gate insulating film for the back gate transistor.

A plurality of memory cells are provided between the drain-side select transistor STD and the back gate transistor with the each of the electrode layers WL as the control gate. Likewise, a plurality of memory cells is provided between the back gate transistor and the source-side select transistor STS with each of the electrode layers WL as the control gate.

These pluralities of memory cells, the drain-side select transistor STD, the back gate transistor, and the source-side select transistor STS are serially connected through the channel body 20 so as to form a single U-shaped memory string MS. This memory string MS is arranged in plurality in the X-axis direction and the Y-axis direction, and therefore a plurality of memory cells are three dimensionally provided in the X-axis direction, Y-axis direction, and Z-axis direction.

Figure 4A:
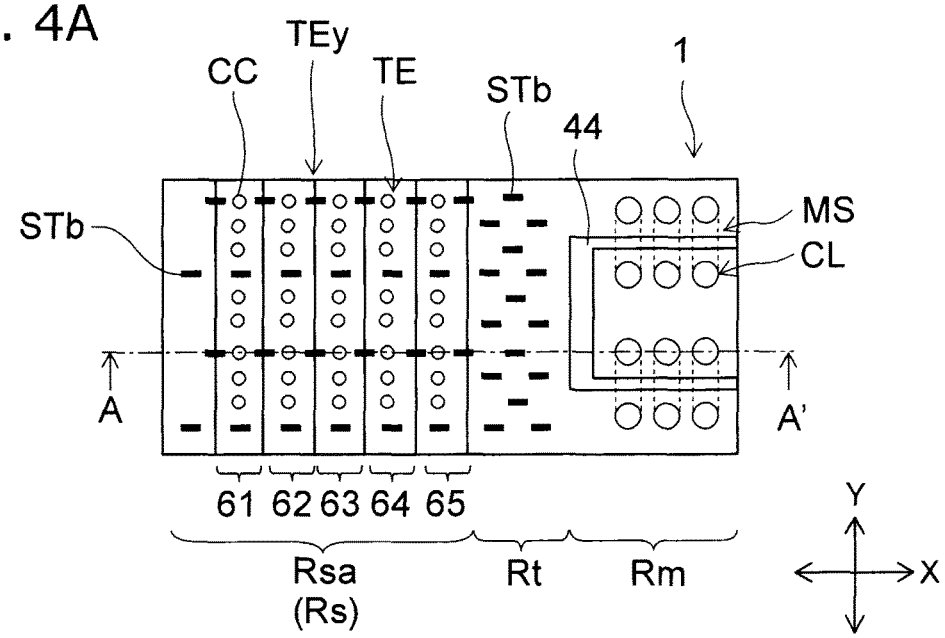
FIG. 4A is a schematic plan view showing an example of a layout of the semiconductor memory device of the embodiment and FIG. 4B is a schematic cross-sectional view of the semiconductor memory device of the embodiment.

FIG. 4A is a schematic plan view showing an example of a layout of the embodiment. FIG. 4A illustrates a peripheral region of the memory cell array 1 in FIG. 1, and is a plan view parallel with the XY plane. In FIG. 4A, portions upper than the electrode layer WL of the topmost layer are omitted.

Figure 4B:
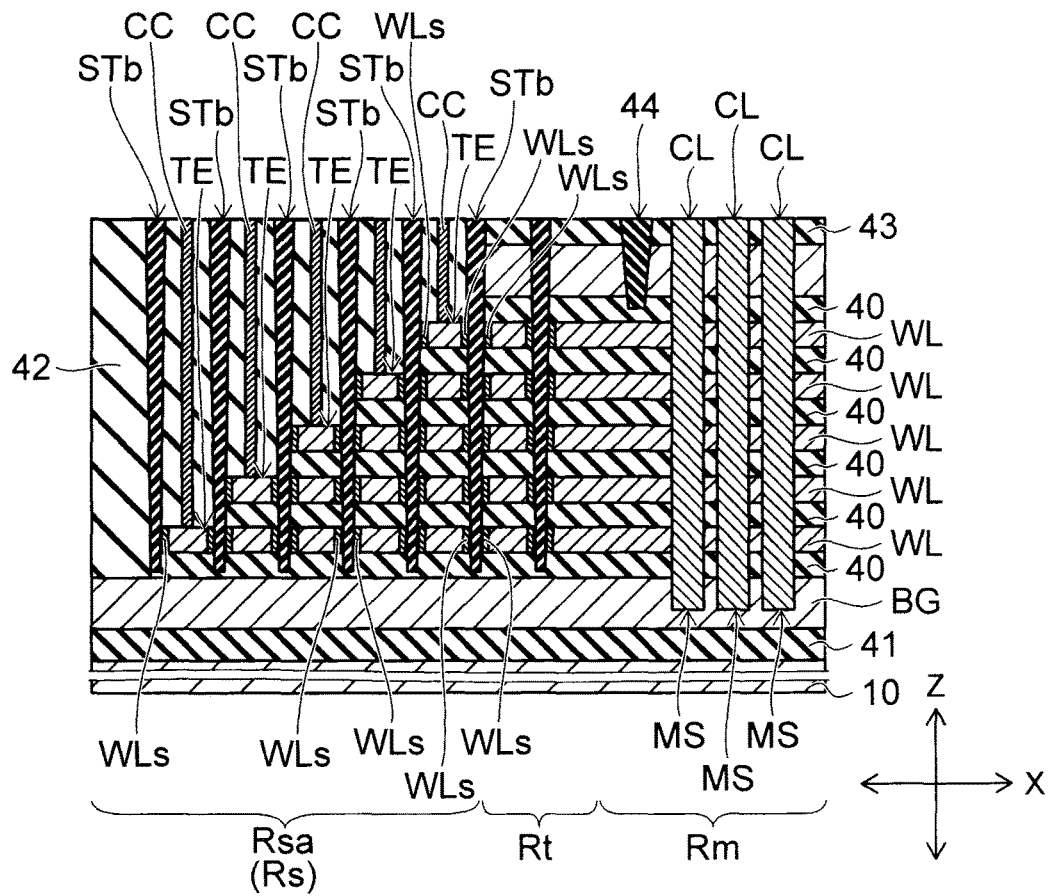

FIG. 4B is a schematic cross-sectional view corresponding to line A-A' in FIG. 4A. FIG. 4B illustrates a cross section parallel with the XZ plane. In FIG. 4B, portions upper than the insulating layer 43 on the select gate layer SG are omitted.

As illustrated in FIG. 4A, the stacked body includes a memory portion Rm, a buffer portion Rt, and a first step portion Rsa (hookup region). The memory cell array 1 is provided in the memory portion Rm. The electrode layer WL is provided stepwise in the first step portion Rsa. The buffer portion Rt is provided between the memory portion Rm and the first step portion Rsa.

The first step portion Rsa includes a plurality of terraces TE and a plurality of contact portions CC. The plurality of terraces TE is provided on a top surface of each electrode layer WL in the first step portion Rsa, the plurality of electrode layers WL is not provided on the plurality of terraces. The plurality of contact portions CC is provided on the plurality of terraces TE.

The plurality of contact portions CC is connected to the plurality of terraces TE, and supplies a current to the electrode layer WL. The number of contact portions CC provided on the plurality of terraces TE is optional. The periphery of the plurality of contact portions CC and the top surface of the plurality of terraces TE are covered by an insulating layer 42.

In FIG. 4A, a boundary portion TEy is provided at the boundary of the plurality of terraces TE provided on each layer of the first step portion Rsa. Heights in the stacking direction (Z-axis direction) of the plurality of terraces TE adjacent to each other with the boundary portion TEy therebetween differ.

In FIG. 4A, five electrode layers WL are provided in the stacked body, and plurality of terraces TE are provided on the respective layers 61 to 65 with the boundary portion TEy therebetween.

In the first step portion Rsa, the number of layers in the stacked body as well as the height of the plurality of terraces TE in the Z-axis direction decreases as the distance from the memory portion Rm increases in the X-axis direction. That is, the topmost layer of the first step portion Rsa in FIG. 4A is the fifth layer 65, and the bottommost layer is the first layer 61. It should be noted that the number of layers of the steps illustrated in the figure is an example, and the total number of layers of the steps is arbitrary.

An insulating portion STb is provided in the first step portion Rsa and the buffer portion Rt. The insulating portions STb pierces each of the first step portion Rsa and the buffer portion Rt in the Z-axis direction, and are provided in a strip (rectangular) shape that is long in the X-axis direction. The insulating portion STb may be formed to be columnar or elliptic columnar, for example.

An insulating film, such as silicon oxide, is embedded in the insulating portion STb. A metal silicide portion WLs of the electrode layer WL is provided between a side surface of the electrode layer WL and a side surface of the insulating portion STb. The metal silicide portion WLs contains, for example, either metal or silicon in addition to the material forming the electrode layer WL. As described later, the metal silicide portion WLs is formed by reacting with the metal on the side surface of the electrode layer WL, for example.

The resistance of the metal silicide portion WLs is lower than the resistance of the electrode layer WL. Accordingly, the metal silicide portion WLs provided on the side surface of the insulating portion STb can be used as a path (current path) through which a current flows from the plurality of contact portions CC to the memory portion Rm.

The insulating portion STb on the first step portion Rsa is provided on the plurality of terraces TE and is separated from the plurality of contact portions CC. The insulating portion Stb is provided between the plurality of contact portions CC, the plurality of contact portions CC is provided on the plurality of terraces TE, for example.

The insulating portion STb may be provided on the boundary portion TEy. Accordingly, the metal silicide part WLs can be provided on two layers of the terraces TE via one insulating portion STb, making it possible to form the current path.

In the direction (X-axis direction) from the first step portion Rsa toward the column CL, the width of the insulating portion STb is shorter than the width of the plurality of terraces TE, for example. As a result, the plurality of terraces TE is not divided by the insulating portion STb in the Y-axis direction.

According to this embodiment, the insulating portion STb is provided on the first step portion Rsa, and the metal silicide portion WLs is provided on the side surface of the insulating portion STb. Accordingly, the resistance in the area from the first step portion Rsa to the memory portion Rm decreases. As a result, even if the distance between the plurality of contact portions CC and the memory portion Rm is long, it is possible to suppress an increase in resistance. That is, even when the surface area of the first step portion Rsa is increased, it is possible to uniformly supply a current from the first step portion Rsa to the memory portion Rm.

Figure 24:
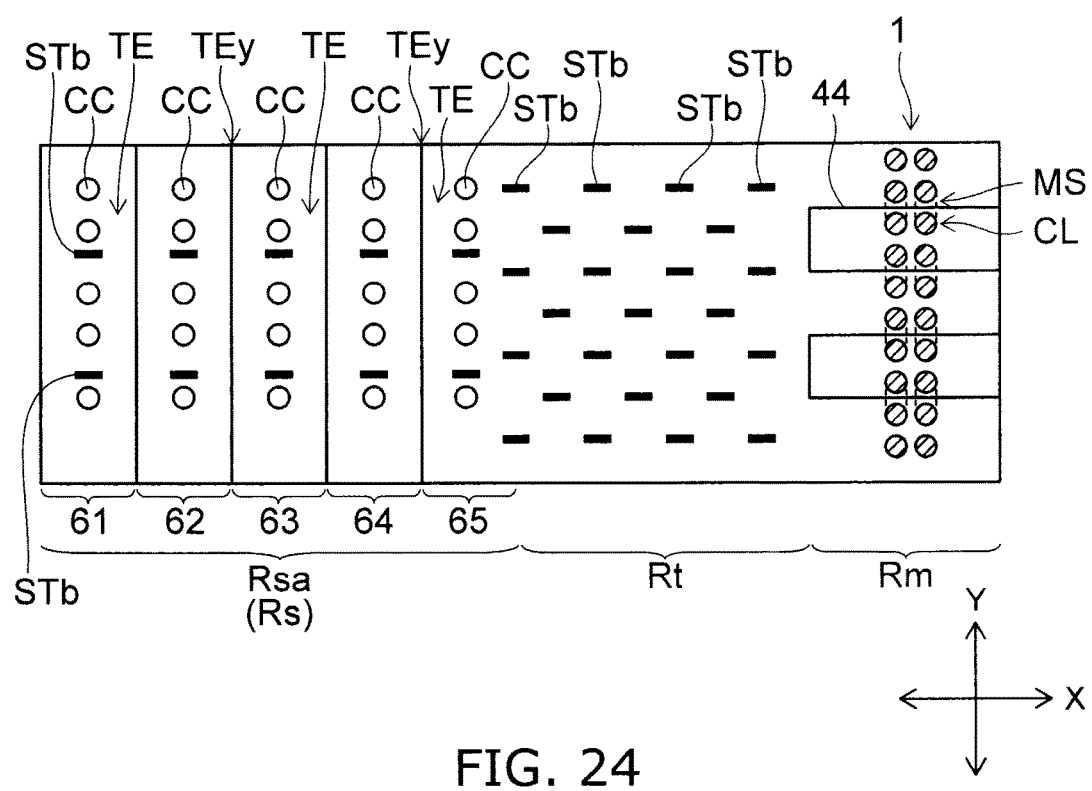
FIG. 24 is a schematic plan view showing an example of a layout of the semiconductor memory device of the embodiment.

In addition to the above, the insulating portion STb of the buffer portion Rt is provided in a staggered arrangement in FIG. 24, for example. Accordingly, the current that flows from the buffer portion Rt to the memory portion Rm can be supplied at the shortest distance, irrespective of the Y-axis direction. Additionally, it is possible to uniformly supply the current without bias in the Y-axis direction.

Furthermore, the width of the insulating portion STb is shorter than the width of the plurality of terraces TE in the X-axis direction. Accordingly, the current can be uniformly supplied without bias in the Y-axis direction. Even if one of the contact portions CC provided on the terrace TE does not function, for example, the current in the Y-axis direction can be uniformly supplied using another contact portion CC.

Next, a description is provided for a manufacturing method of a semiconductor memory device of an embodiment with reference to FIGS. 5A to 10.

FIGS. 5A and 6 to 10 are schematic cross-sectional views of the XZ plane, and FIG. 5B is a schematic cross-sectional view of the YZ plane.

As illustrated in FIG. 5A, the back gate BG is formed on the substrate 10 with the insulating layer 41 disposed therebetween. A sacrificial film 55 is embedded in a portion of the back gate BG within the memory portion Rm. The stacked body is formed on the back gate BG, the stacked body includes the plurality of electrode layers WL and the insulating layers 40. The electrode layers WL are separately stacked each other. For example, the insulating layers 40 and the electrode layers WL are alternately stacked.

A boron-doped polysilicon, for example, is used as the back gate BG and the electrode layers WL. For the insulating layers 40, silicon oxide, for example, may be used.

As illustrated in FIG. 5B, a slit ST (first slit) is formed on the sacrificial film 55, the slit ST pierces the stacked body. A bottom end of the slit ST is positioned within the stacked body, and does not reach the sacrificial film 55.

A sacrificial film 56 is embedded in the slit ST. For the sacrificial film 56, at least one of nitride silicon and amorphous silicon is used. The sacrificial film 56 formed on the stacked body is removed by etching.

Figure 6:
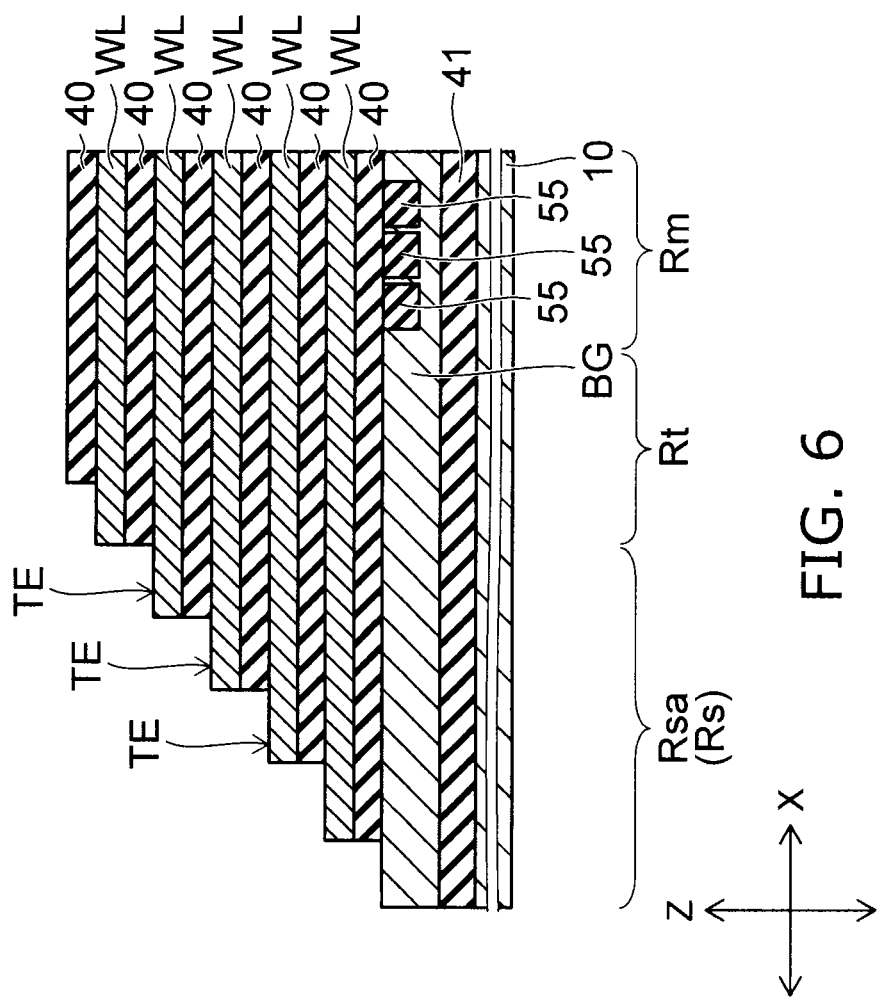

As illustrated in FIG. 6, the stacked body is removed stepwise, and a step portion Rs (the first step portion Rsa) is formed. The buffer portion Rt is formed between the step portion Rs and the memory portion Rm. For the method of removing the stacked body stepwise, a method of alternately repeating mask formation by lithography and etching by reactive ion etching (RIE) is used, for example. At this time, the plurality of terraces TE is formed on the top surface of the plurality of electrode layers WL exposed on the step portion Rs. The terrace TE is formed on each layer that forms the step structure.

The stacked body of the step portion Rs decreases in the number of stacked layers as the distance from the memory portion Rm increases, forming low step layers.

Figure 7:
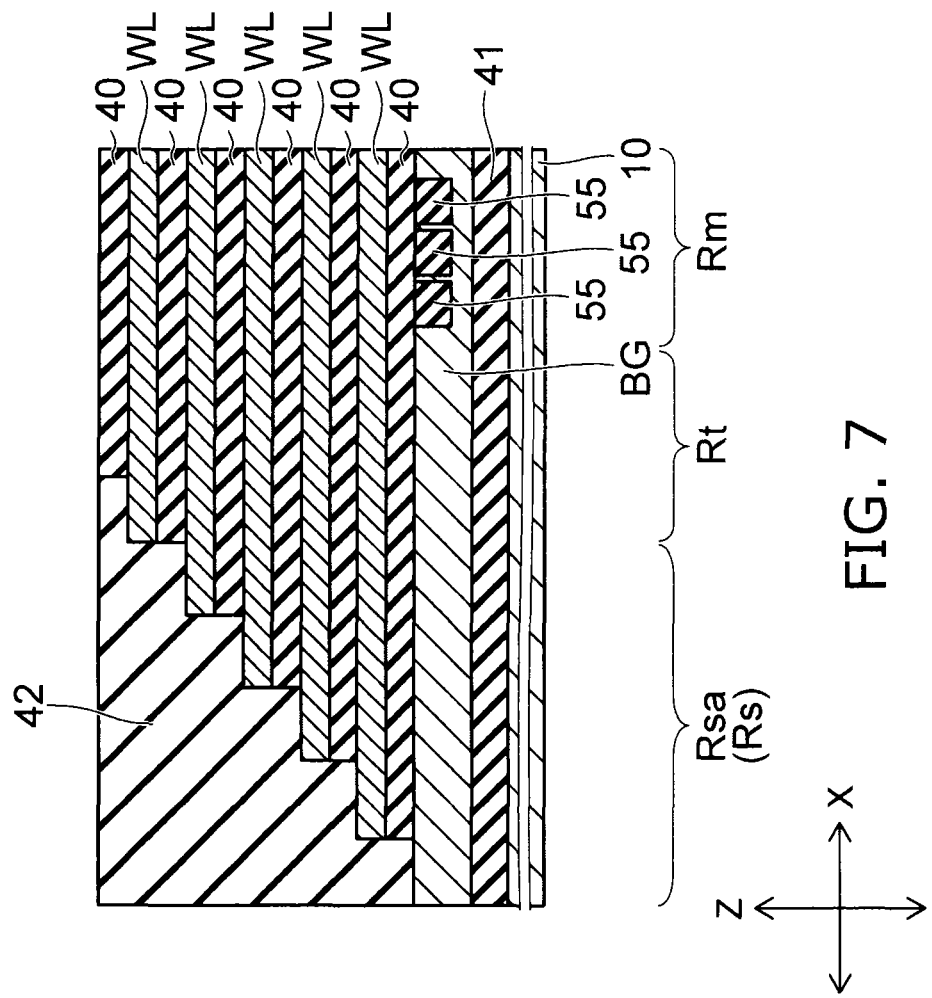

As illustrated in FIG. 7, the insulating layer 42 is formed on the step portion Rs. The insulating layer 42 is embedded in a portion where the stacked body has been removed. Subsequently, the insulating layer 42 formed on the top surface of the buffer portion Rt and the memory portion Rm is removed by chemical mechanical polishing (CMP).

Figure 8:
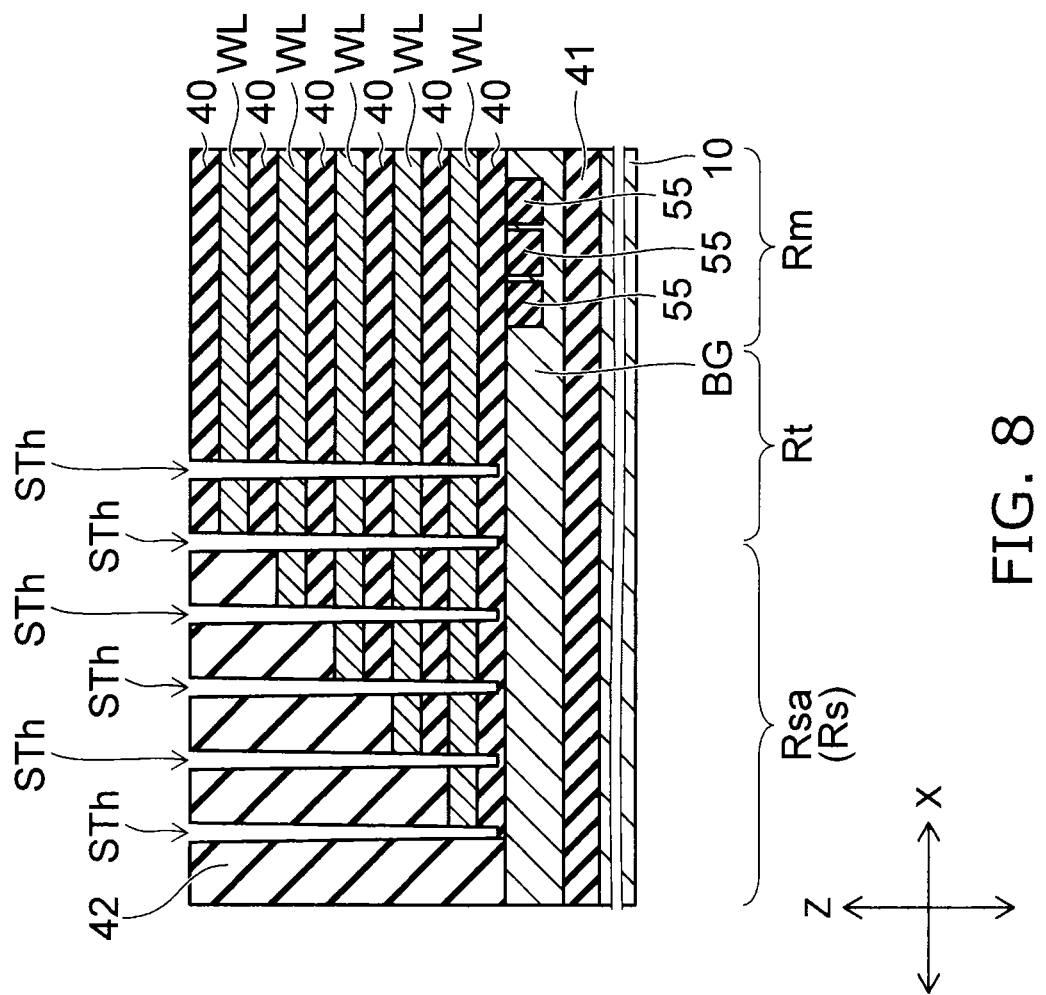

As illustrated in FIG. 8, a slit STh (second slit) is formed in the step portion Rs and the buffer portion Rt. The slit STh is formed by, for example, RIE in which a mask (not illustrated) is used.

In the step portion Rs, the slit STh is formed so as to pierce the insulating layer 42 and the stacked body thereunder. In the buffer portion Rt, the slit STh is formed so as to pierce the stacked body. A sidewall of the electrode layer WL is exposed on the sidewall of the slit STh.

The slit STh is formed in a strip shape that is long in the X-axis direction as viewed from the Z-axis direction. In the buffer portion Rt, the slit STh is arranged, for example, in a staggered arrangement as viewed from the Z-axis direction.

Figure 9:
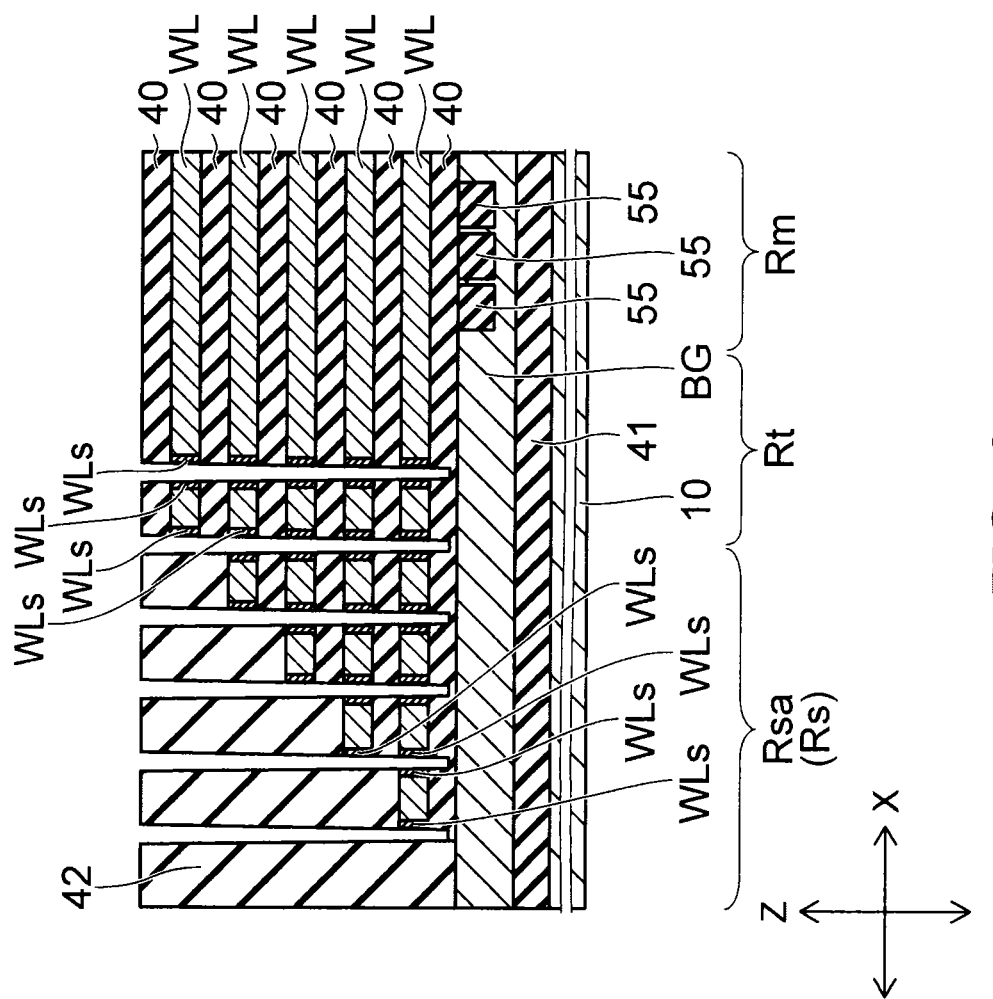

Subsequently, as illustrated in FIG. 9, metal silicide processing on the electrode layer WL is performed through the slit STh. For the metal silicide processing on the electrode layer WL, a metal film is, for example, conformally formed on the sidewall of the slit STh, and annealed at a high temperature. Accordingly, the silicon included in the electrode layer WL reacts with the metal. Then, the metal silicide portion WLs is formed on the sidewall of the electrode layer WL exposed on the slit STh.

Accordingly, the metal silicide portion WLs having a lower resistance than the electrode layer WL is formed between the sidewall of the slit STh and the electrode layer WL.

Figure 10:
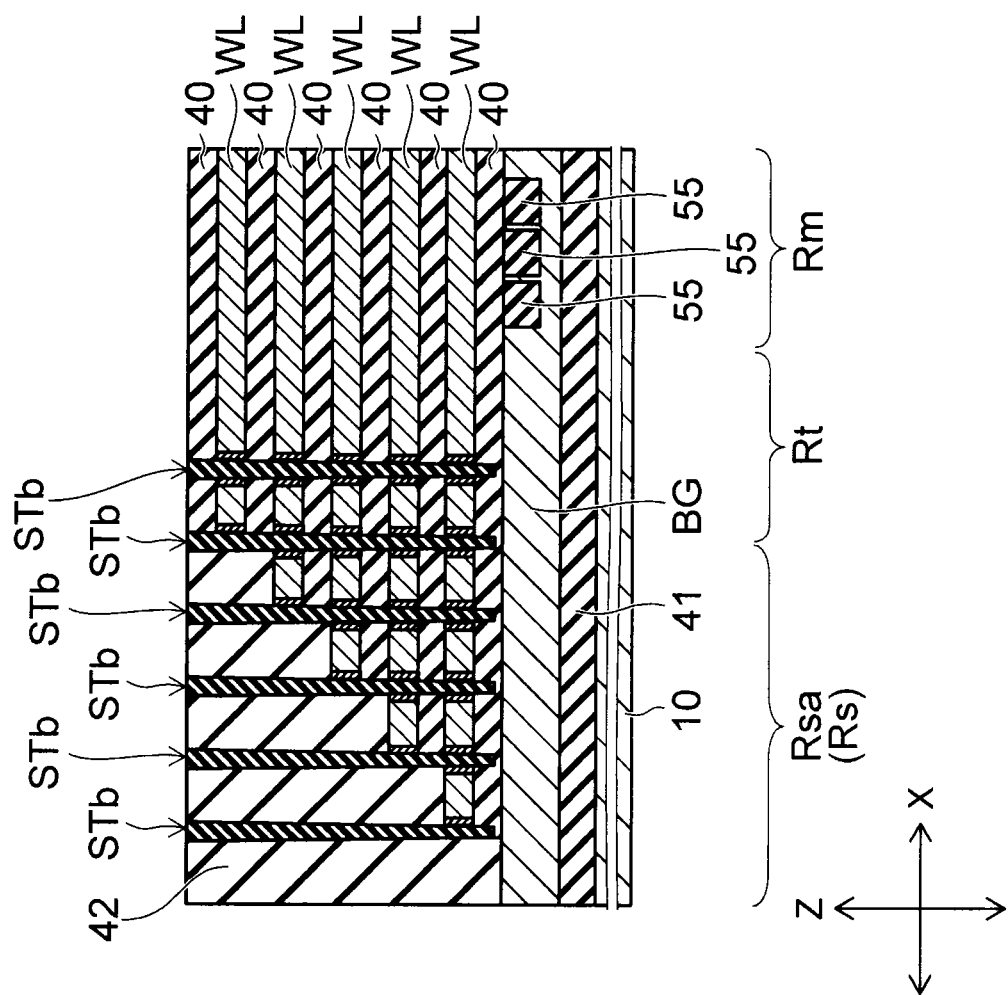

As illustrated in FIG. 10, an insulating film is embedded in the slit STh. The sidewall of the insulating film comes into contact with the metal silicide portion WLs of the electrode layer WL. As a result, the insulating portion STb is formed. For the insulating film embedded in the slit STh, silicon oxide, for example, is used. Subsequently, the insulating film formed on the top surface of the insulating layer 42, the buffer portion Rt, and the memory portion Rm is removed.

Next, the select gate layer SG is formed on the stacked body, and the insulating layer 43 is formed on the select gate layer SG. Subsequently, a pair of holes is formed, the pair of holes pierces an area from the insulating layer 43 to the stacked body thereunder to the sacrificial film 55. The pair of holes is formed so as to interpose the slit ST. The sacrificial film 55 is exposed on the bottom of the slit ST.

Subsequently, the sacrificial film 55 is removed through the slit ST. As a result, one U-shaped memory hole is formed.

After the memory hole is formed, each of the films (including the memory film 30, the channel body 20, and the like) illustrated in FIG. 3 is formed in order on the inner wall of the memory hole. Accordingly, the columns CL are formed.

Next, a slit SGh (third slit) is formed between the memory portion Rm and the buffer portion Rt, and between the columns CL. The slit SGh pierces the insulating layer 43 and the select gate layer SG to the stacked body. The slit SGh formed between the pair of columns CL reaches the slit ST, and the sacrificial film 56 is exposed on the bottom of the slit SGh.

Subsequently, the sacrificial film 56 is removed through the slit SGh. After the sacrificial film 56 is removed, an insulating film is embedded in the slit SGh and the slit ST. Before the insulating film is embedded, metal silicide processing on the electrode layers WL and the select gate layer SG may be performed through the slit ST and the slit SGh.

As a result, as illustrated in FIGS. 2 and 4B, insulating separators 44, 46 are formed. The source-side select gate SGS and drain-side select gate SGD are formed so as to interpose the insulating separator 44.

Subsequently, the contact portions CC are formed on the terraces TE, and the bit lines BL, the source layer SL, and the like are formed on the insulating layer 43. Accordingly, the semiconductor memory device of this embodiment is obtained.

According to this embodiment, the insulating portion STb is formed on the step portion Rs and the buffer portion Rt, and the metal silicide portion WLs is formed on the sidewall of the insulating portion STb. As a result, an increase in resistance associated with the enlargement of the step portion Rs can be suppressed, making it possible to supply current uniformly.

Next, another method for manufacturing a semiconductor memory device of the embodiment will be described with reference to FIG. 11A to FIG. 18B.

FIGS. 11A, 12 to 16A, 17A, and 18A are schematic cross-sectional views of the XZ plane, and FIGS. 11B, 16B, 17B, and 18B are schematic cross-sectional views of the YZ plane.

Figure 11A:
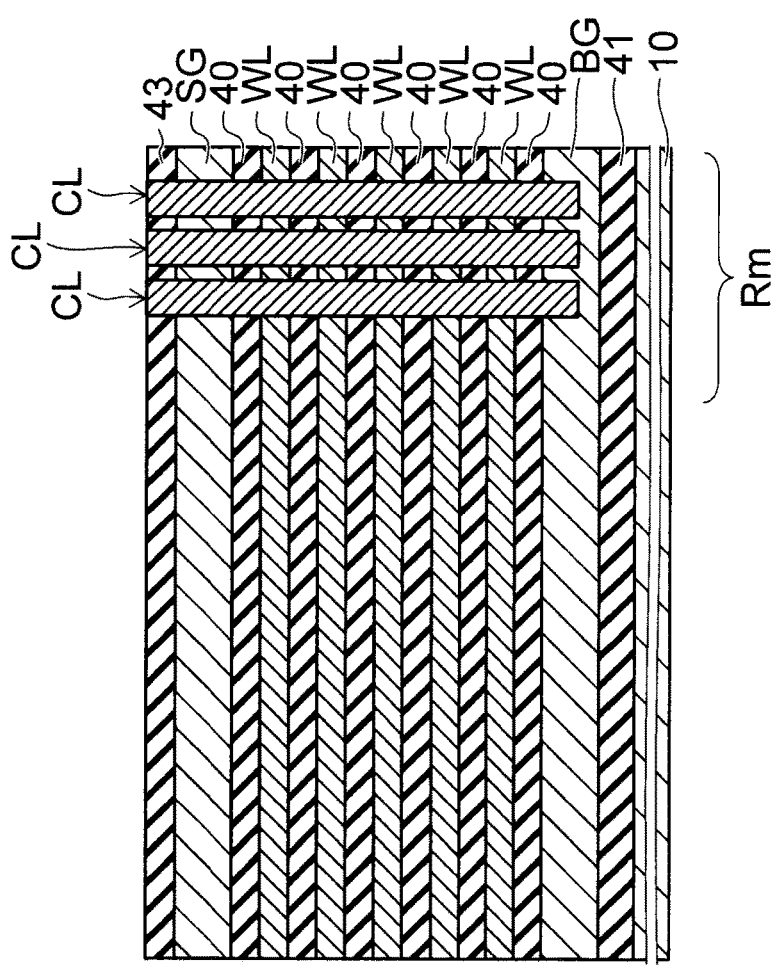
Figure 11B:
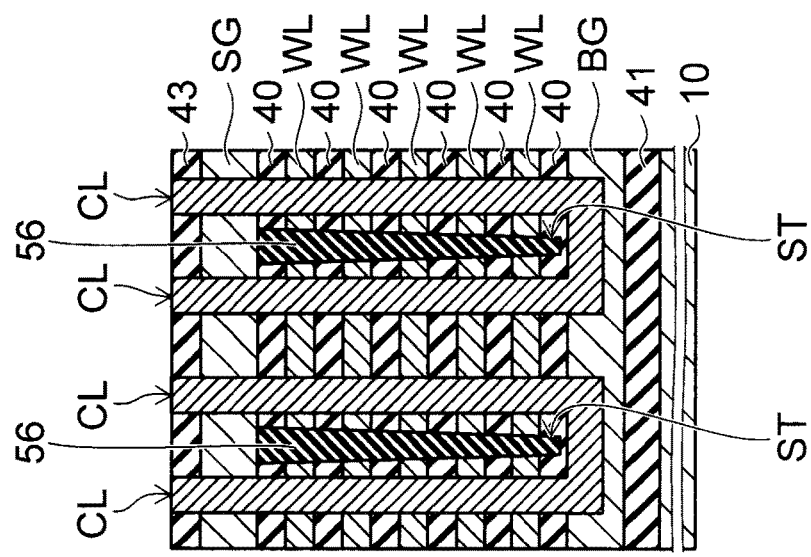

As illustrated in FIGS. 11A and 11B, in this manufacturing method, the columns CL are formed before the formation of the step portion Rs.

The back gate BG is formed on the substrate 10 with the insulating layer 41 disposed therebetween. The sacrificial film 55 is embedded in a portion of the back gate BG. The stacked body having the insulating layers 40 and the electrode layers WL alternately stacked is formed on the back gate BG.

Subsequently, the slit ST is formed on the sacrificial film 55, the slit ST pierces the stacked body, and the sacrificial film 56 is embedded in the slit ST.

Next, the select gate layer SG is formed on the stacked body, and the insulating layer 43 is formed on the select gate layer SG.

Subsequently, a pair of holes is formed, the pair of holes extends from the insulating layer 43 to the sacrificial film 55 through the stacked body. The pair of holes is formed so as to interpose the slit ST. The sacrificial film 55 is exposed on the bottom of the holes.

Next, the sacrificial film 55 is removed through the holes. As a result, one U-shaped memory hole is formed.

After the memory hole is formed, each of the films (including the memory film 30, the channel body 20, and the like) illustrated in FIG. 3 is formed in order on the inner wall of the memory hole. As a result, as illustrated in FIG. 11B, the columns CL are formed.

Figure 12:
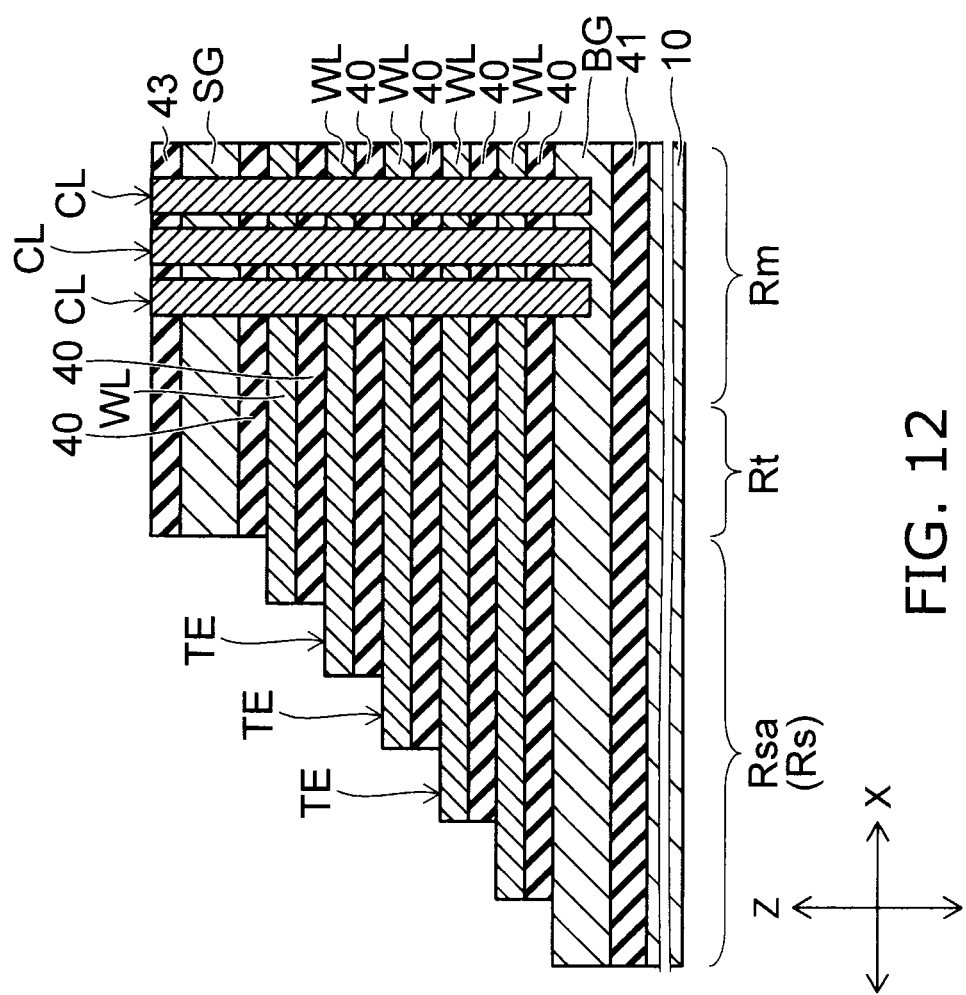

As illustrated in FIG. 12, the stacked body is removed stepwise, and the step portion Rs (the first step portion Rsa) is formed. The buffer portion Rt is formed between the step portion Rs and the memory portion Rm. For the method of removing the stacked body stepwise, a method of alternately repeating mask formation by lithography and etching by RIE is used, for example. At this time, the plurality of terraces TE is formed on the top surface of the plurality of electrode layers WL exposed on the step portion Rs. The plurality of terraces TE is formed on each layer that forms the step structure.

The stacked body of the step portion Rs decreases in the number of stacked layers as the distance from the memory portion Rm increases, forming low step layers.

Figure 13:
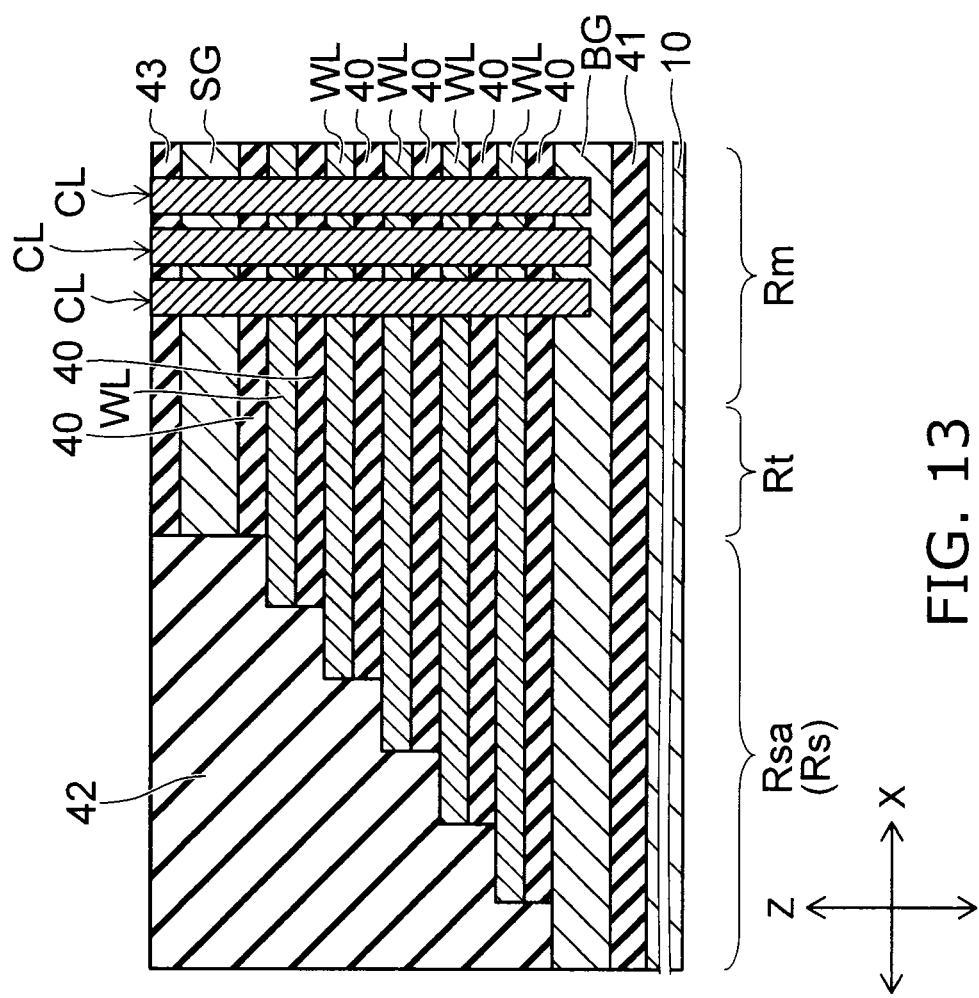

As illustrated in FIG. 13, the insulating layer 42 is formed on the step portion Rs. The insulating layer 42 is embedded in the portion where the stacked body has been removed. Subsequently, the insulating layer 42 formed on the top surface of the insulating layer 43 is removed by CMP or the like.

Figure 14:
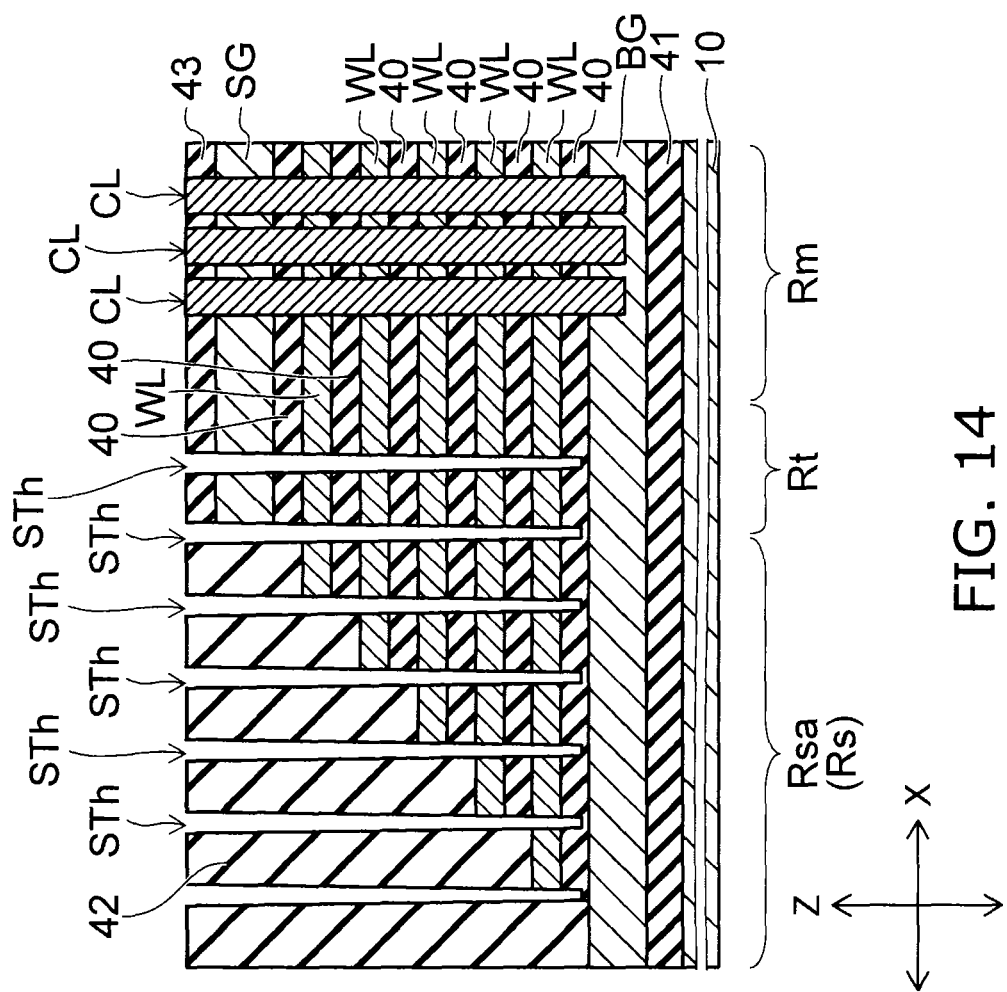

As illustrated in FIG. 14, the slit STh is formed in the step portion Rs and the buffer portion Rt. The slit STh is formed by RIE, for example, using a mask (not illustrated).

In the step portion Rs, the slit STh is formed piercing the insulating layers 42, 43 and the stacked body thereunder. The side surface of the electrode layer WL is exposed on the sidewall of the slit STh.

The slit STh is formed in a strip shape that is long in the X-axis direction as viewed from the Z-axis direction. In the buffer portion Rt, the slit STh is arranged, for example, in a staggered arrangement as viewed from the Z-axis direction. The slit STh is, for example, formed on a boundary portion of the plurality of terraces TE.

Figure 15:
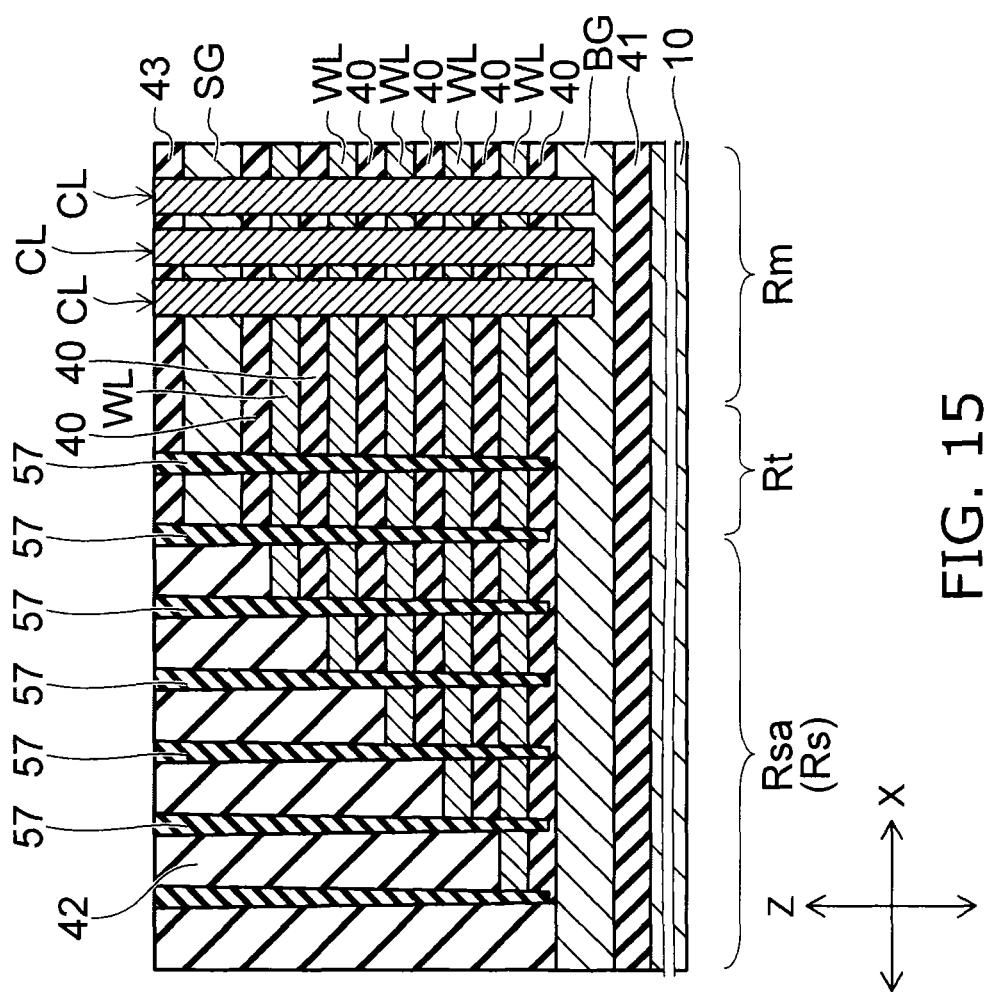

Subsequently, as illustrated in FIG. 15, a sacrificial film 57 is embedded in the slit STh. The same material as that of the sacrificial film 56 embedded in the slit ST is used for the sacrificial film 57, for example. It should be noted that the sacrificial film 57 may not be embedded in the slit STh.

Figures 16A, 16B:
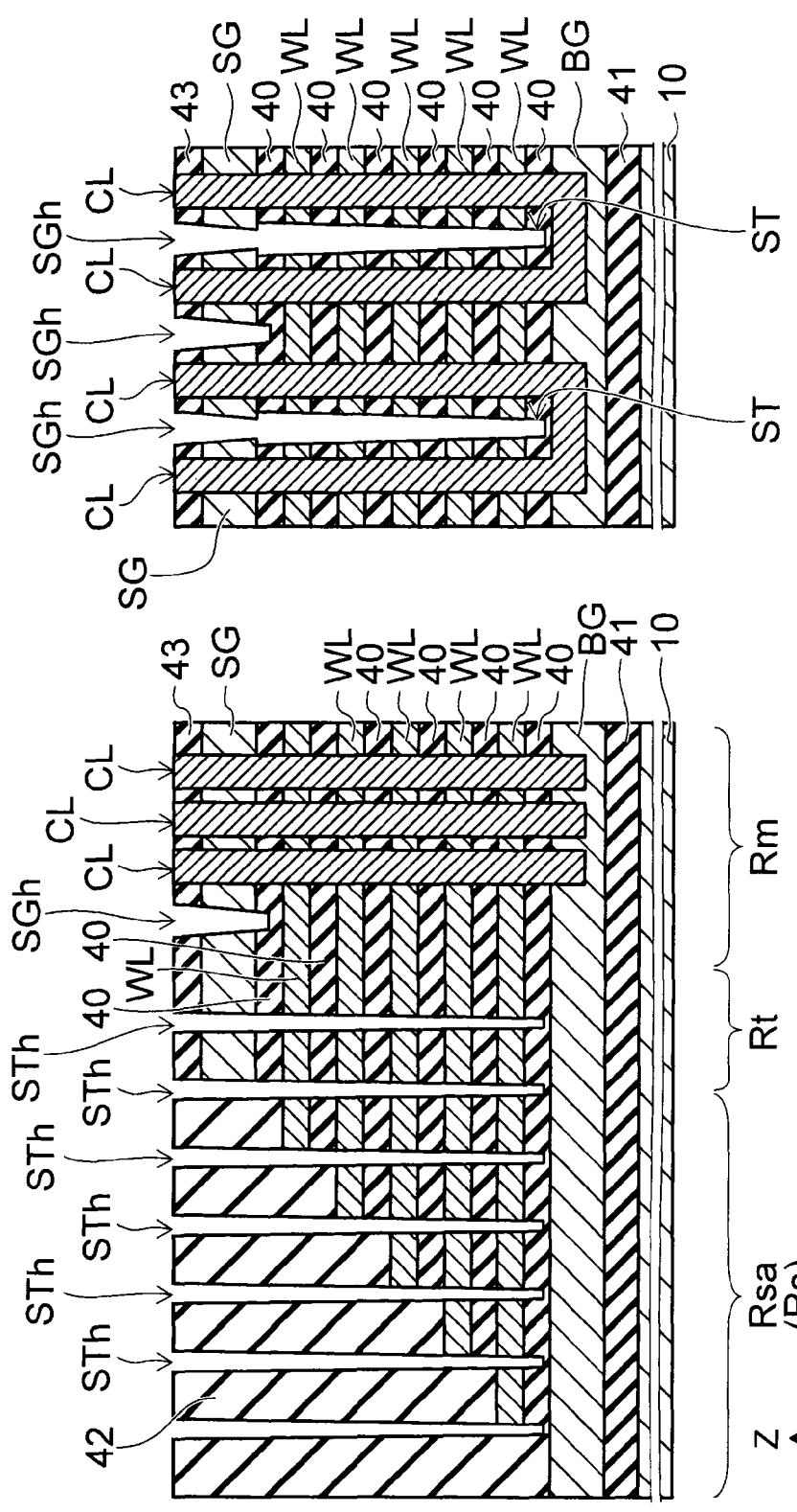

Next, the slit SGh is formed between the memory portion Rm and the buffer portion Rt, and between the pair of columns CL, as illustrated in FIGS. 16A and 16B. The slit SGh pierces the insulating layer 43 and the select gate layer SG to reach the stacked body.

The side surface of the select gate layer SG is exposed on the wall face of the slit SGH. The slit SGh formed between the pair of columns CL reaches the slit ST, and the sacrificial film 56 is exposed on the bottom of the slit SGh.

Subsequently, the sacrificial film 56 is removed by wet etching through the slit SGh. At this time, the sacrificial film 57 formed in the slit STh is also simultaneously removed.

Figures 17A, 17B:
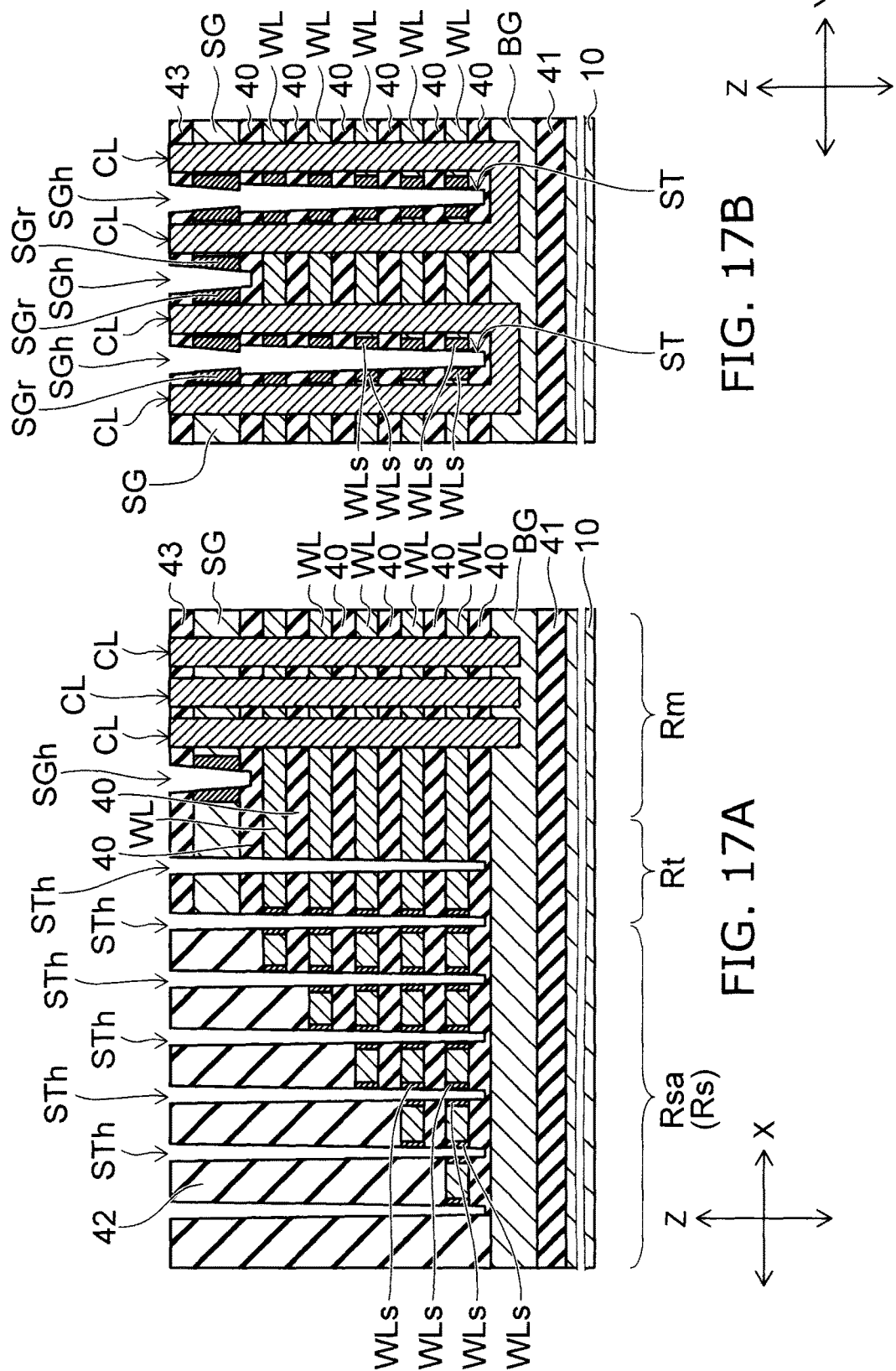

As illustrated in FIGS. 17A and 17B, metal silicide processing on the electrode layers WL is performed through the slit STh and the slit ST. At this time, metal silicide processing on the select gate layer SG is also simultaneously performed through the slit SGh.

Accordingly, the metal silicide portion WLs having a lower resistance than the electrode layer WL is formed between the sidewall of the slit STh and the electrode layer WL. A metal silicide portion SGr having a lower resistance than the select gate layer SG is formed between the sidewall of the slit SGh and the select gate layer SG.

Figures 18A, 18B:
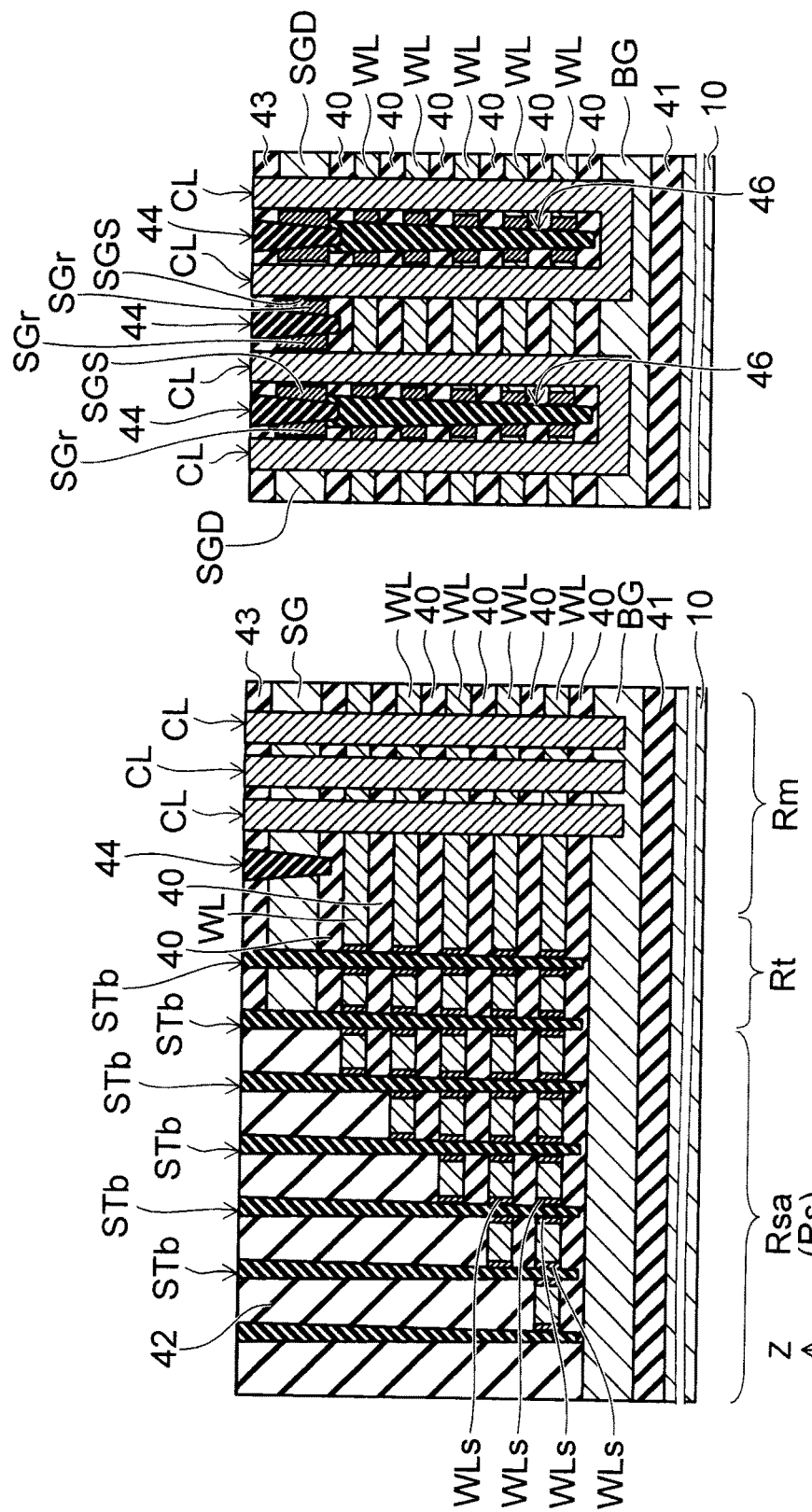

As illustrated in FIG. 18A, an insulating film is embedded in the slit STh. The sidewall of the insulating film comes into contact with the metal silicide portion WLs of the electrode layer WL. As a result, the insulating portion STb is formed.

As illustrated in FIG. 18B, the insulating film is embedded in the slit ST and the slit SGh, and the insulating separators 44, 46 are formed. The sidewall of the insulating separator 46 comes into contact with the metal silicide portion WLs of the electrode layer WL. The sidewall of the insulating separator 44 comes into contact with the metal silicide portion SGr of the select gate layer SG. Accordingly, the source-side select gate SGS and drain-side select gate SGD are formed so as to interpose the insulating separator 44.

Subsequently, the contact portions CC are formed on the terraces TE, and the bit lines BL, the source layer SL, and the like are formed on the insulating layer 43. Accordingly, the semiconductor memory device of this embodiment is obtained.

According to this embodiment, the metal silicide processing through the slit STh, the slit ST, and the slit SGh is simultaneously performed. As a result, in addition to the aforementioned embodiment, production efficiency can be improved.

Figure 19:
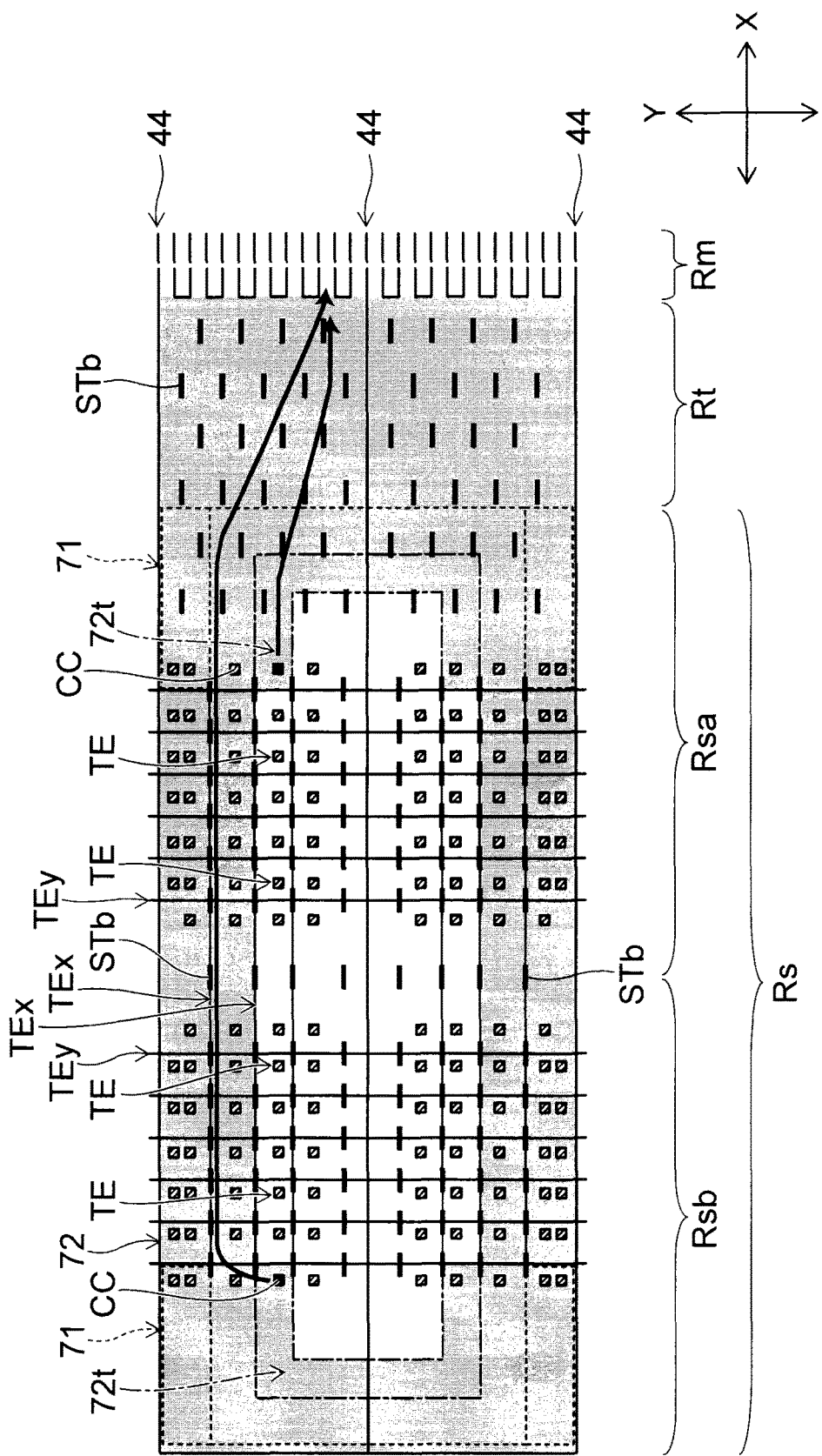
FIG. 19 to FIG. 22 are schematic plan views of the semiconductor memory device of another embodiment.

FIG. 19 is a schematic plan view of another embodiment. FIG. 19 illustrates a peripheral region of a memory cell array, and is a plan view parallel with the XY plane. In FIG. 19, portions upper than the electrode layer WL of the topmost layer are omitted.

As illustrated in FIG. 19, the step portion Rs is provided in the X-axis direction of the memory portion Rm. The step portion Rs includes the first step portion Rsa and the second step portion Rsb both having the same shape. The shape of the second step portion Rsb is, for example, a mirror image of the shape of the first step portion Rsa in relation to the YZ plane.

The first step portion Rsa is provided between the second step portion Rsb and the memory portion Rm. The buffer portion Rt is provided between the first step portion Rsa and the memory portion Rm. That is, the first step portion Rsa is provided between the second step portion Rsb and the buffer portion Rt.

Mirror images of the shapes of the memory portion Rm, the buffer portion Rt, and the step portion Rs in relation to the YZ plane are provided with the insulating separator 44 as the boundary.

The step portion Rs, similar to the aforementioned embodiment, is a region where the electrode layers WL extending from the memory portion Rm are connected to the contact portions CC. For this reason, a step structure in which each of the electrode layers WL extending from the memory portion Rm is a step is provided in the step portion Rs.

In the step structure, the plurality of terraces TE is provided on the top surface of each of the electrode layers WL. The insulating layer 42 is provided on the plurality of terraces TE.

The plurality of contact portions CC is provided on the plurality of terraces TE. The plurality of contact portions CC is connected to the plurality of terraces TE, and supplies a current to the electrode layer WL.

The boundary portion TEy that extends in the Y-axis direction is provided at the boundary of each layer. The heights of the terraces TE adjacent to each other with the boundary portion TEy therebetween differ.

In the first step portion Rsa, the number of layers in the stacked body as well as the height of the plurality of terraces TE decreases as the distance from the memory portion Rm increases. Meanwhile, in the second step portion Rsb, the number of layers in the stacked body as well as the height of the plurality of terraces TE increases as the distance from the memory portion Rm increases.

Steps are provided in the step portion Rs in the Y-axis direction as well. A boundary portion TEx is provided on the boundary portion in the Y-axis direction, and the heights of the terraces TE adjacent to each other with the boundary portion TEx therebetween differ. As a result, the terraces TE of the step portion Rs are provided in a grid pattern as viewed from the Z-axis direction.

As illustrated in FIG. 19, for example, 28 electrode layers WL are used. That is, the number of terraces TE is 28. In the first step portion Rsa, provided are seven terraces TE in the X-axis direction and four terraces in the Y-axis direction.

At this time, a step between the terraces TE with the boundary portion TEy therebetween corresponds to one electrode layer WL. A step between the terraces TE with the boundary portion TEx therebetween corresponds to seven electrode layers WL.

Figure 20A:
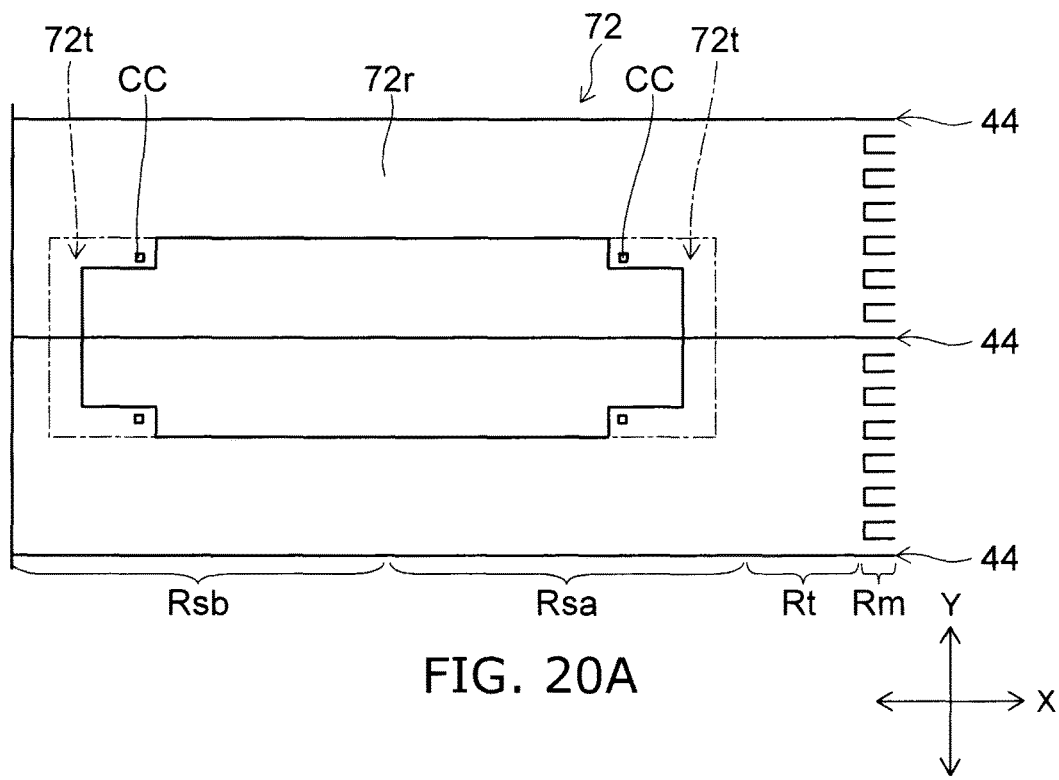

FIG. 20A is a plan view illustrating an intermediate layer 72 (third step from the topmost step and 15th layer from the topmost layer in the Y-axis direction) corresponding to the region of the colored section in FIG. 19.

A bridge portion 72r that connects the first step portion Rsa and the second step portion Rsb is provided on the intermediate layer 72. Accordingly, the intermediate layer 72 is integrally provided between the first step portion Rsa and the second step portion Rsb via the bridge portion 72r. The intermediate layer 72 includes a terrace 72t and the two of the plurality of contact portions CC in each of the first step portion Rsa and the second step portion Rsb.

The plurality of contact portion CC provided in the second step portion Rsb supplies a current to the memory portion Rm via the bridge portion 72r. As a result, the resistance in the area from the second step portion Rsb to the memory portion Rm depends on the length of the bridge portion 72 provided between the first step portion Rsa and the second step portion Rsb.

Figure 20B:
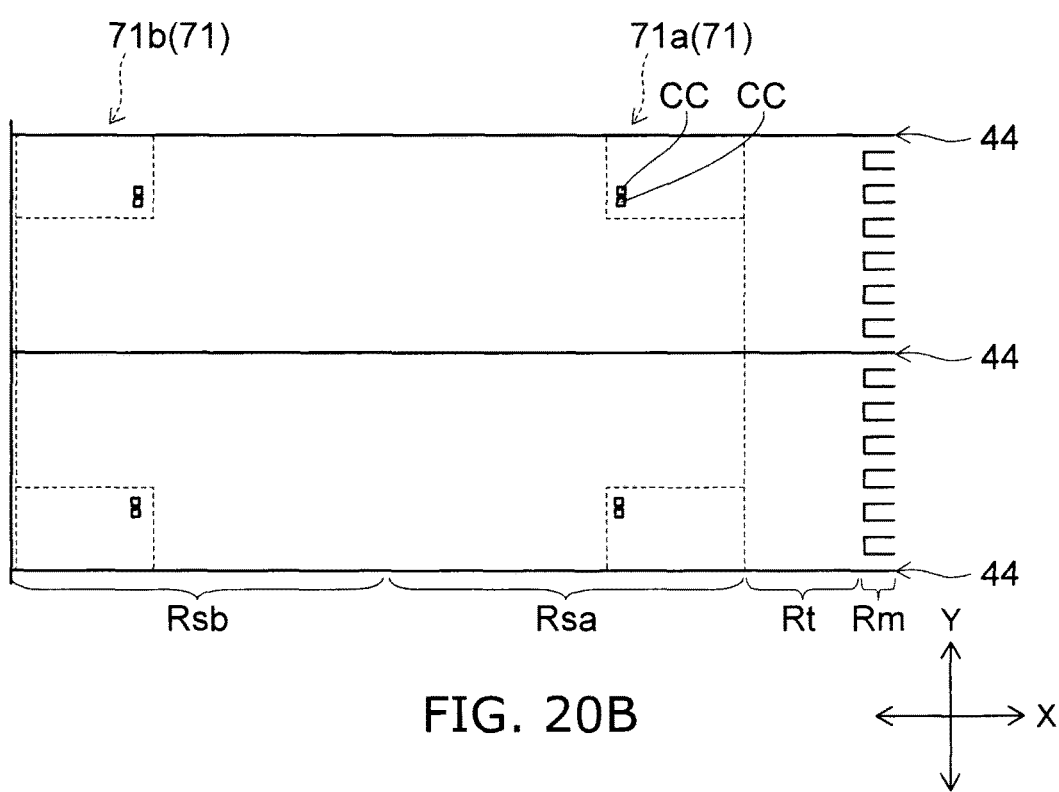

FIG. 20B is a plan view illustrating a topmost layer 71 (first step from the topmost step and first layer from the topmost layer in the Y-axis direction) corresponding to the region of the dotted-line section in FIG. 19.

In the topmost layer 71, a first topmost layer 71a is provided on the first step portion Rsa, a second topmost layer 71b is provided on the second step portion Rsb, and a bridge portion is not included. The topmost layer 71 includes the four of the plurality of contact portions CC in each of the first step portion Rsa and the second step portion Rsb. The topmost layer 71 does not include a bridge portion, and therefore a current is not supplied from the second topmost layer 71b to the memory portion Rm.

As illustrated in FIG. 19, the insulating portion STb is provided to the step portion Rs and the buffer portion Rt. The insulating portion STb pierces the stacked body in the Z-axis direction, and is provided in a strip (rectangular) shape that is long in the X-axis direction.

An insulating film, such as silicon oxide, is embedded in the insulating portion STb. The metal silicide portion WLs of the electrode layer WL is provided between the insulating portion STb and the electrode layer WL.

The resistance of the metal silicide portion WLs of the electrode layer WL is lower than the resistance of the electrode layer WL. Accordingly, the metal silicide portion WLs provided on the side surface of the insulating portion STb can be used as a current path.

As illustrated in FIG. 19, the insulating portions STb are provided, for example, on the boundary portion TEx and the boundary portion TEy. Accordingly, the metal silicide portion WLs used as the current path can be formed on a greater number of layers than when the insulating portions STb are formed on the terraces TE.

In addition to the above, the arrangement can lead to a decrease in the possibility of coming into contact with the contact portions CC when forming the insulating portions STb, improving productivity.

Figure 21:
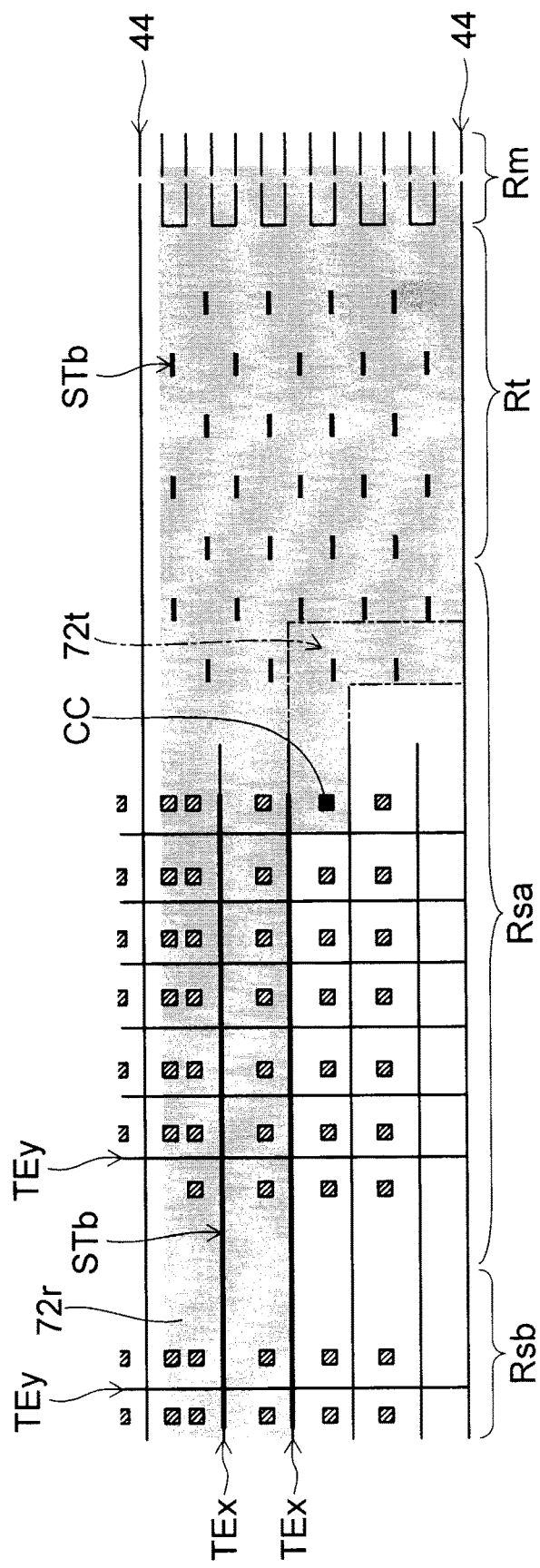

For example, as illustrated in FIG. 21, the insulating portions STb may be continuously provided on the boundary portion TEx, from the second step portion Rsb to the first step portion Rsa. Accordingly, the resistance of the step portion Rs can be decreased more than when the insulating portions STb are intermittently formed.

The arrows in FIG. 19 illustrate paths through which the current flows from the contact portions CC to the memory portion Rm. The current is supplied to the memory portion Rm at the shortest distance via the metal silicide portions WLs on the side surfaces of the insulating portions STb. As a result, even if the distance between the contact portions CC and the memory portion Rm is long, it is possible to suppress resistance. As a result, even when the surface area of the step portion Rs is increased, it is possible to uniformly supply the current from the step portion Rs to the memory portion Rm.

In the buffer portion Rt, the insulating portions STb are provided in a staggered arrangement, for example. Accordingly, the current that flows from the buffer portion Rt to the memory portion Rm can be supplied at the shortest distance, without bias in the Y-axis direction. Additionally, it is possible to uniformly supply the current without bias in the Y-axis direction.

It should be noted that the arrangement of the insulating portions STb may be optional as long as the arrangement makes it possible to uniformly supply the current to the memory portion Rm. The arrangement of the insulating portions STb may also be provided so that equilateral triangles and isosceles triangles are formed when the centers of the respective insulating portions STb are connected, for example.

According to this embodiment, similar to the aforementioned embodiment, even in a case where the step portion Rs is enlarged, it is possible to suppress an increase in resistance and to uniformly supply the current to the memory portion Rm.

Figure 22:
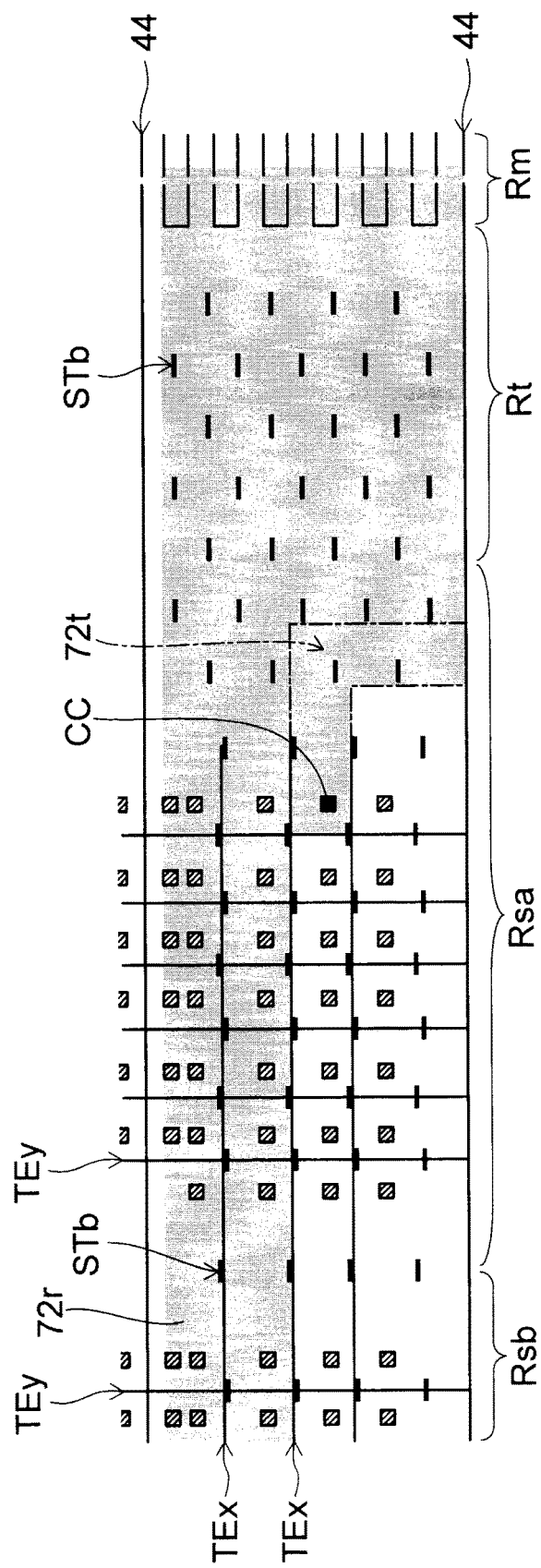

FIG. 22 is a schematic plan view of yet another embodiment. FIG. 22 illustrates a peripheral region of a memory cell array, and is a plan view parallel with the XY plane. In FIG. 22, portions upper than the electrode layer of the topmost layer of the stacked body are omitted.

As illustrated in FIG. 22, the insulating portions STb are alternately provided across the boundary portions TEx. Accordingly, the insulating portions STb and the metal silicide portions WLs can be formed on all terraces without dependence on the accuracy at which the insulating portions STb are formed. Additionally, the arrangement makes it possible to suppress increases in resistance associated with fluctuations in the insulating portions STb when the positions of terraces TE fluctuate due to process fluctuations and the like.

According to this embodiment, similar to the aforementioned embodiment, the current is supplied to the memory portion Rm at the shortest distance via the metal silicide portions WLs on the side surfaces of the insulating portions STb. As a result, even if the distance between the contact portions CC and the memory portion Rm is long, it is possible to suppress resistance. As a result, even when the surface area of the step portion Rs is increased, it is possible to uniformly supply the current from the step portion Rs to the memory portion Rm.

In the buffer portion Rt, the insulating portions STb are provided in a staggered arrangement, for example. Accordingly, the current that flows from the buffer portion Rt to the memory portion Rm can be supplied at the shortest distance, without bias in the Y-axis direction. Additionally, it is possible to uniformly supply the current without bias in the Y-axis direction.

It should be noted that the arrangement of the insulating portions STb may be optional as long as the arrangement makes it possible to uniformly supply the current to the memory portion Rm. The arrangement of the insulating portions STb may also be provided so that equilateral triangles and isosceles triangles are formed when the centers of the respective insulating portions STb are connected, for example.

According to this embodiment, similar to the aforementioned embodiment, even in a case where the step portion Rs is enlarged, it is possible to suppress an increase in resistance and to uniformly supply the current to the memory portion Rm.

Figure 23:
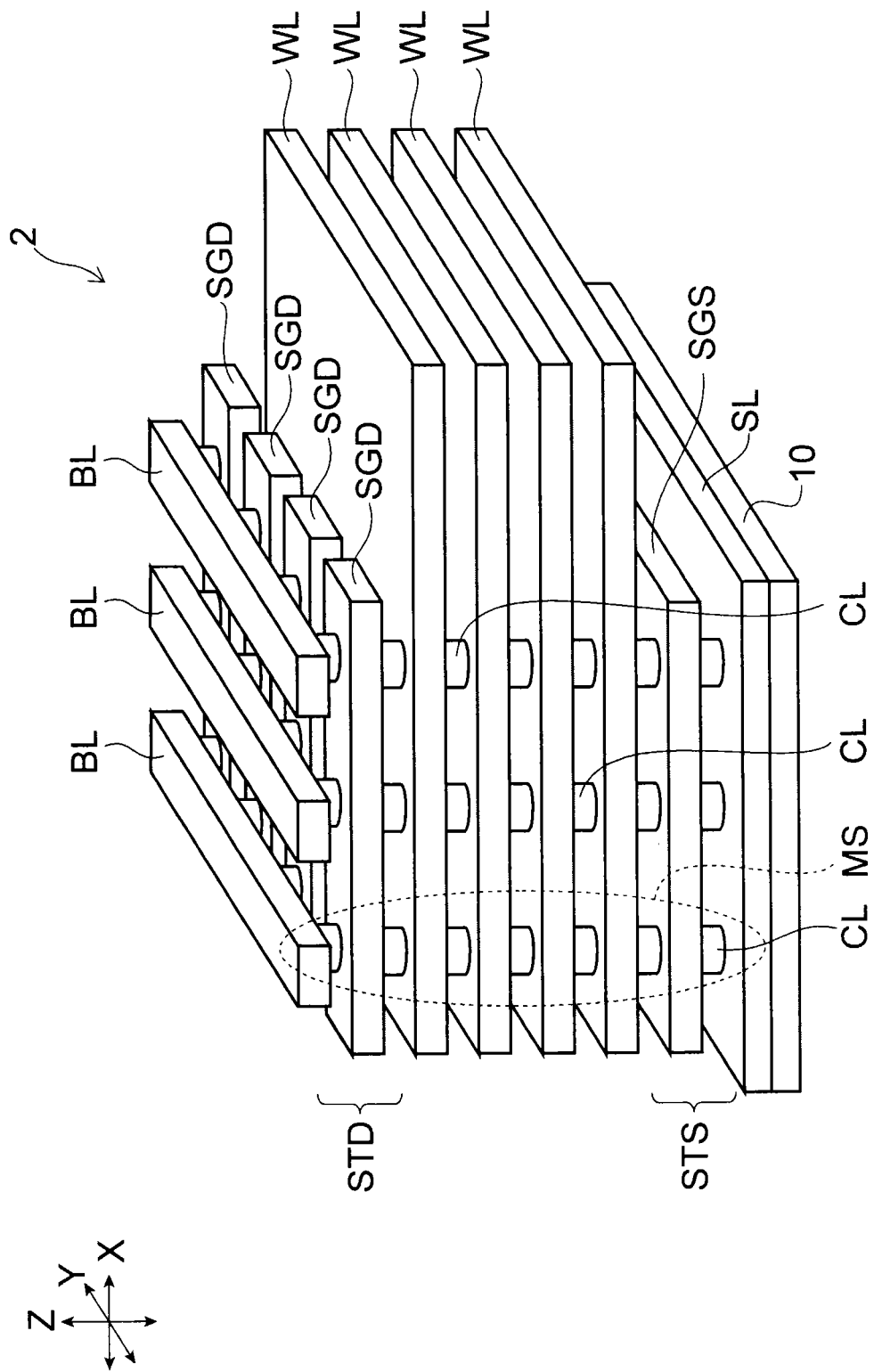
FIG. 23 is a schematic perspective view of a memory cell array of another example of a the semiconductor memory device of the embodiment.

FIG. 23 is a schematic perspective view of a memory cell array 2 of another example of a semiconductor memory device according to an embodiment. Note that, as in FIG. 1, for simplicity, elements such as the insulating layer are not illustrated in FIG. 23 as well.

In FIG. 23, two directions that are parallel to the major surface of the substrate 10 and orthogonal to one another are defined as the X-axis direction and the Y-axis direction and a direction orthogonal to both X and Y-directions is defined as the Z-axis direction (stacking direction).

The source layer SL is provided on the substrate 10. The source-side select gate (lower portion select gate) SGS is provided on the source layer SL with an insulating layer disposed therebetween.

The insulating layer is provided on the source-side select gate SGS, and a stacked body in which a plurality of the electrode layers WL and a plurality of the insulating layers are alternately stacked is provided on the insulating layer.

An insulating layer is provided on the electrode layer WL of the topmost layer, and the drain-side select gate (upper select gate) SGD is provided on the insulating layer.

The aforementioned column CL that extends in the Z-axis direction is provided in the stacked body. That is, the column CL pierces the drain-side select gate SGD, the plurality of electrode layers WL, and the source-side select gate SGS. The top end of the channel body 20 in the column CL is connected to the bit line BL, and the bottom end of the channel body 20 is connected to the source layer SL.

In the memory cell array 2 illustrated in FIG. 23 as well, similar to the aforementioned embodiments, the insulating portions STb and the metal silicide portions WLs are formed on the step portion Rs and the buffer portion Rt, making it possible to suppress increases in resistance associated with enlargement of the step portion Rs and to uniformly supply current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a substrate;
a stacked body provided on the substrate, the stacked body including a plurality of electrode layers and a first step portion, the plurality of electrode layers separately stacked each other, the first step portion having the plurality of electrode layers provided stepwise;
a column provided in a region of the stacked body other than a region in the first step portion provided, the column extending in a stacking direction of the stacked body and including:
a semiconductor film extending in the stacking direction, and
a charge storage film provided between the semiconductor film and the plurality of electrode layers; and
a plurality of insulating portions provided in the first step portion, and extending in the stacking direction;
the stacked body including:
a metal silicide portion provided between the plurality of insulating portions and the plurality of electrode layers,
a plurality of terraces provided on a top surface of each of the plurality of electrode layers of the first step portion, and
a plurality of contact portions provided on the plurality of terraces.

2. The device according to claim 1, wherein the plurality of insulating portions are provided in a strip shape, the strip shape is long in a direction of from the first step portion toward the column, as viewed from the stacking direction.

3. The device according to claim 1, wherein the plurality of insulating portions are provided on a boundary portion of the plurality of terraces.

4. The device according to claim 1, wherein the plurality of insulating portions are provided separately from the plurality of contact portions.

5. The device according to claim 1, wherein a width of the plurality of insulating portions is shorter than a width of the plurality of terraces, in a direction of from the first step portion toward the column.

6. The device according to claim 1, wherein the stacked body includes a second step portion having a shape corresponding to a mirror image of a shape of the first step portion; and the first step portion is provided between the second step portion and the column.

7. The device according to claim 6, wherein the plurality of insulating portions are continuously provided in a direction of from the second step portion toward the first step portion.

8. The device according to claim 7, wherein the plurality of insulating portions are provided on a boundary portion of the plurality of terraces.

9. The device according to claim 6, wherein the plurality of insulating portions are alternately provided across a boundary portion of the plurality of terraces, the boundary portion of the plurality of terraces extending in a direction of from the second step portion toward the first step portion.

10. The device according to claim 6, wherein the plurality of terraces is arranged in a grid pattern, as viewed from the stacking direction.

11. The device according to claim 6, wherein the stacked body includes a buffer portion provided between the column and the first step portion, the electrode layers are not provided stepwise in the buffer portion.

12. The device according to claim 11, wherein the plurality of insulating portions are provided in a staggered arrangement in the buffer portion, as viewed from the stacking direction.

13. A method of manufacturing a semiconductor memory device, comprising:

forming a stacked body on a substrate, the stacked body including a plurality of electrode layers separately stacked each other;

forming a first slit piercing the stacked body and extending in a stacking direction of the stacked body;

forming a first step portion in a region of the stacked body other than the region in the first slit formed, the first step portion having a plurality of terraces formed on a top surface of each of the electrode layers;

forming a plurality of second slits in the first step portion, the second slits piercing the stacked body and extending in the stacking direction;

forming a metal silicide portion on a side surface of the electrode layers exposed on a sidewall of the second slits;

forming an insulating portion by embedding an insulating film in the second slits; and forming a column piercing the stacked body and extending in the stacking direction, in the region in the first slit formed.

14. The method according to claim 13, wherein the second slits is formed in a strip shape, the strip shape is long in a direction of from the first step portion toward the column, as viewed from the stacking direction.

15. The method according to claim 13, wherein the second slits is formed on a boundary portion of the plurality of terraces.

16. The method according to claim 13, further comprising forming a second step portion having a shape corresponding to a mirror image of a shape of the first step portion.

17. The method according to claim 16, wherein the plurality of insulating portions are alternately formed across a boundary portion of the plurality of terraces.

18. The method according to claim 16, wherein the plurality of terraces is formed in a grid pattern, as viewed from the stacking direction.

19. A method of manufacturing a semiconductor memory device, comprising:

forming a stacked body on a substrate, the stacked body including a plurality of electrode layers separately stacked each other;

forming a first slit piercing the stacked body and extending in a stacking direction of the stacked body;

embedding a sacrificial film in the first slit;

forming a column piercing the stacked body and extending in the stacking direction, in a region in the first slit formed;

forming a first step portion in a region of the stacked body other than the region in the first slit formed, the first step portion having a plurality of terraces formed on a top surface of each of the electrode layers;

forming a plurality of second slits in the first step portion, the plurality of second slits piercing the stacked body and extending in the stacking direction;

removing the sacrificial film embedded in the first slit;

forming a metal silicide portion on a side surface of the electrode layers exposed on a sidewall of the first slit and a sidewall of the second slits; and forming an insulating portion by embedding an insulating film in the second slits.

20. The method according to claim 19, wherein the second slits is formed in a strip shape, the strip shape is long in a direction of from the first step portion toward the column, as viewed from the stacking direction.

* * * * *